United States Patent [19]
Goto et al.

[11] Patent Number: 5,528,390
[45] Date of Patent: Jun. 18, 1996

[54] EXPOSURE APPARATUS FOR REPRODUCING A MASK PATTERN ONTO A PHOTO-SENSITIVE SURFACE OF A SUBSTRATE USING HOLOGRAPHIC TECHNIQUES

[75] Inventors: Akihiro Goto; Takashi Genma, both of Tokyo; Yutaka Ichihara, Kanagawa; Nobutaka Magome, Kanagawa; Naomasa Shiraishi, Kanagawa; Toshio Matsuura, Tokyo; Hiroshi Shirasu, Kanagawa; Masami Ebi, Tokyo, all of Japan

[73] Assignee: Nikon Corporation, Tokyo, Japan

[21] Appl. No.: 461,105

[22] Filed: Jun. 5, 1995

Related U.S. Application Data

[63] Continuation of Ser. No. 346,827, Nov. 30, 1994, abandoned, which is a continuation of Ser. No. 19,613, Feb. 19, 1993, abandoned.

[30] Foreign Application Priority Data

| Feb. 20, 1992 | [JP] | Japan | 4-033658 |
| Feb. 21, 1992 | [JP] | Japan | 4-034779 |
| Mar. 5, 1992 | [JP] | Japan | 4-048261 |
| Mar. 31, 1992 | [JP] | Japan | 4-074924 |
| Jun. 15, 1992 | [JP] | Japan | 4-178912 |
| Aug. 27, 1992 | [JP] | Japan | 4-250493 |
| Sep. 3, 1992 | [JP] | Japan | 4-258883 |

[51] Int. Cl.[6] .............................. G03H 1/04; G03H 1/20
[52] U.S. Cl. .................... 359/12; 359/30; 359/35
[58] Field of Search ........................ 359/11, 12, 3, 359/27, 30, 35

[56] References Cited

U.S. PATENT DOCUMENTS

| 4,857,425 | 8/1989 | Phillips . | |
| 5,151,799 | 9/1992 | Ansley | 359/30 |
| 5,216,527 | 6/1993 | Sharnoff et al. | 359/30 |

OTHER PUBLICATIONS

Karl A. Stetson, GCA Corporation, Bedford, Massachusetts, entitled "Holography With Total Internally Reflected Light" vol. 11, No. 7, Applied Physics Letters, Oct., 1967.

Jack Feinberg, Dept. of Physics, University of Southern California, Los Angeles, California, entitled "Self Pumped, Continuous–Wave Conjugator Using Internal Reflection", vol. 7, No. 10, Optics Letters, Oct., 1982.

Primary Examiner—Martin Lerner
Attorney, Agent, or Firm—Michael N. Meller

[57] ABSTRACT

An exposure apparatus for reproducing a mask pattern onto a photo-sensitive surface of a substrate using holographic techniques. The apparatus comprises support means for holding a hologram recording plate at a predetermined position both during recording operation and reconstructing operation, a first illuminating optical system for introducing a light beam from a coherent light source to a mask and irradiating a subject beam produced from the mask into the recording plate, a second illuminating optical system for irradiating the light beam from the coherent light source as a reference beam into the recording plate, a carrier apparatus for disposing during reconstructing operation a substrate at the position of the mask in place of the mask, a third illuminating optical system for irradiating a conjugate beam with the reference beam into the recording plate, in which a hologram has been formed by recording operation, to form an image of the hologram on the photo-sensitive surface of the substrate, and a controller for selectively controlling the first, second and third illuminating optical systems to put an at least selected one of them into an operative condition so as to irradiate a fixing light beam into the recording plate in order to fix the hologram.

8 Claims, 12 Drawing Sheets

EXPOSURE APPARATUS FOR REPRODUCING A MASK PATTERN ONTO A PHOTO-SENSITIVE SURFACE OF A SUBSTRATE USING HOLOGRAPHIC TECHNIQUES

This application is a continuation, of application Ser. No. 08/346,827, filed Nov. 30, 1994, now abandoned which is a continuation of application Ser. No. 08/019,613, filed Feb. 19, 1993, now abandoned.

BACKGROUND OF THE INVENTION

1. Field of the Invention

This invention relates to an exposure apparatus for reproducing a fine pattern of a mask, for example, for manufacturing semiconductor devices onto a photo-sensitive surface of a substrate using holographic techniques.

2. Description of the Prior Art

As to a holographic technique useful for exposure to reproduce a fine pattern of integrated circuits onto a resist layer which is coated on a wafer, K. A. Stetson discloses a report entitled "Holography with Total Internally Reflected Light" in Applied Physics Letters, Vol. 11, No. 7, Oct. 1, 1967, pp.225–226.

Recording and reconstruction of a hologram of the type mentioned are performed in the following manner. First, upon recording operation, a coherent light beam is irradiated upon a mask, and a subject beam transmitted through and diffracted by the mask enters into a recording medium while another coherent reference beam enters into the recording medium from the opposite side to the mask by way of a prism. Then, the reference beam is totally internally reflected from a boundary of the recording medium from the air. Consequently, the incident and totally reflected reference beams and the subject beam interfere with each other within the recording medium to form interference fringes corresponding to the mask pattern in the recording medium and record them as a hologram. Meanwhile, reconstruction of the thus recorded hologram is performed by irradiating a reconstructing beam conjugate with the reference beam into the hologram recording medium. In this instance, if a wafer is disposed at the position of the mask in place of the mask, then a real image (mask pattern) of the hologram is formed on the wafer. For example, N. J. Phillips actually discloses, in U.S. Pat. No. 4,857,425, a process for manufacturing integrated circuits using holographic techniques of the type just described.

Conventionally, silver halide or dichromated gelatin (DCG) is employed as a recording medium for a hologram. Silver halide photo-sensitive materials are advantageous in that the sensitivity is high and the photo-sensitive wavelength band is wide while DCG materials are advantageous in that a high diffraction efficiency is obtained and the scattering is little. However, both materials require development and fixation by liquid after exposure, and in order to perform those processes, it is necessary to remove the recording medium once from the exposure apparatus after exposure.

In recent years, photo-polymeric materials have been and are being developed as the recording medium for a hologram. Among photo-polymeric materials which are utilized as the recording medium for a hologram, those materials of the type wherein interference fringes are formed on the real time basis simultaneously with exposure, that is, those materials which require substantially no development, are considered promising. However, also photo-polymeric materials of the type just described require a process of fixing interference fringes (hologram) by irradiating light such as ultraviolet rays uniformly over the entire area of the material after exposure for formation of the hologram. Further, a post-baking process for increasing the refractive index of the hologram by uniform heating is sometimes required. Those processing steps are performed after the recording medium onto which a hologram has been formed is removed once from the exposure apparatus.

As regards exposure of a mask pattern using holography techniques, it has been reported already that a fine pattern of a line width of, for example, 0.5 μmm or so can be reproduced. To this end, however, it is necessary for a reconstructing beam, which is completely conjugate with a reference beam used for formation of a hologram, to enter into the recording medium to obtain a reconstruction image of the hologram. Accordingly, even if an exposure optical system for a recording operation and a reconstruction optical system for a reconstructing operation are incorporated in the same apparatus, if the recording medium is removed from the apparatus in order to perform developing and fixing processes after a recording operation, then an alignment error occurs when the recording medium is installed into the apparatus again, and consequently, it cannot be avoided that the fidelity of a reconstruction image of a fine pattern is deteriorated. Further, since it must be prevented, in a developing or fixing process which is performed outside the apparatus, for unnecessary light to enter into the recording medium for a long period of time until the process is completed including removal and re-mounting of the recording medium, a substantially dark room process is required. Besides, since much time is required for those processes, the problem is pointed out that the operation efficiency is low and the through-put cannot be enhanced.

SUMMARY OF THE INVENTION

It is a principal object of the present invention to provide an exposure apparatus wherein a recording medium need not be removed during formation and recording process of a hologram on the recording medium and reproduction process of a mask pattern onto a photo-sensitive substrate by exposure reconstruction of the thus recorded hologram so that the steps of recording, fixing, post-baking which is performed when necessary, and reconstruction of the hologram can be performed while keeping the recording medium at a set position as that of the first set position in a non-recorded condition, thereby to prevent otherwise possible deterioration of a reconstruction image caused by occurrence of an alignment error and to enhance the operation efficiency and the through-put.

It is another object of the present invention to provide an exposure apparatus which can efficiently set, when a photo-polymeric recording medium onto which interference fringes can be recorded on the real time basis is used as a recording medium for a hologram, optimum conditions of actual individual recording media as exposure conditions and fixing conditions upon recording operation.

It is a further object of the present invention to provide an exposure apparatus wherein the accuracy in formation of interference fringes at a recording step of a hologram is increased so that a reconstruction image of a higher fidelity can be obtained.

It is a still further object of the present invention to provide an exposure apparatus wherein the deterioration or deformation of a recording medium is reduced and the accuracy in recording of a hologram is improved to allow reconstruction of a more precise pattern.

It is a yet further object of the present invention to provide an exposure apparatus wherein necessary interference fringes can be formed efficiently upon recording operation of a hologram and the accuracy in recording and reproduction is enhanced so that a reconstruction image of a higher fidelity can be obtained.

It is a yet further object of the present invention to provide an exposure apparatus wherein the diffraction efficiency and the resolution of a hologram are enhanced and production of unnecessary exposure light components is prevented to the utmost upon reconstructing operation so that a high quality ultra-fine pattern free from irregularities can be reproduced.

It is an additional object of the present invention to provide an exposure apparatus which makes the easy adjustment of an optical system, compact construction of the apparatus and realization of the reproduction for fine pattern with a high degree of accuracy.

According to one aspect of the present invention, there is provided an exposure apparatus for reproducing a pattern of a mask on a photo-sensitive surface of a substrate using holographic techniques, comprising:

a hologram recording plate provided with a photo-polymeric recording medium layer in which a hologram can be recorded by a photochemical reaction;

coherent light source means for generating a coherent light beam;

support means adapted to hold the recording plate at a predetermined position both upon recording operation for forming a volume hologram in the recording plate and upon reconstructing operation for forming an image of the thus formed hologram;

a first illuminating optical system for introducing, upon the recording operation, the coherent light beam from the coherent light source means to the mask disposed in a spaced relationship from the recording plate with a predetermined gap left therebetween and for irradiating a subject beam produced from the mask then into the recording medium layer of the recording plate through the gap;

a second illuminating optical system for irradiating, upon the recording operation, the coherent light beam from the coherent light source means as a reference beam into the recording plate so that interference fringes thereof with the subject beam is formed in the recording medium layer;

means for disposing, upon the reconstructing operation, the substrate at the position of the mask in place of the mask;

a third illuminating optical system for irradiating, upon the reconstructing operation, a conjugate beam with the reference beam for the recording operation into the recording plate in which a volume hologram corresponding to the pattern is formed by the recording operation to form an image of the hologram on the photo-sensitive surface of the substrate; and control means for controlling at least one of the first illuminating optical system, the second illuminating optical system and the third illuminating optical system to put into an operative condition so as to irradiate a fixing light beam from said selected optical system into the recording plate held by the support means in order to fix the hologram formed in the recording plate by the recording operation.

The exposure apparatus may further comprise a polarization converting optical element, which controls the polarizing direction of the fixing light beam so that the fixing light beam may not form standing waves in the recording medium layer of the recording plate.

In one case, either one of the first illuminating optical system and the second illuminating optical system is selectively put into an operative condition by the control means during the fixing operation.

In another case, both of the first illuminating optical system and the second illuminating optical system are put into an operative condition by the control means during the fixing operation, and in this instance, polarization converting means is further provided for converting the polarization condition of at least one of a first fixing light beam which reaches the recording medium layer from the first illuminating optical system and a second fixing light beam which reaches the recording medium layer from the second illuminating optical system so that the first fixing light beam from the first illuminating optical system and the second fixing light beam from the second illuminating optical system may not interfere with each other in the recording medium layer.

The conjugate beam for the reconstructing operation may be provided from the coherent light beam from the coherent light source means.

Alternatively, reconstructing light source means for generating an incoherent light beam for the conjugate beam may be provided separately, and in this instance, during the fixing operation, the incoherent light beam can be utilized as the fixing light beam. To this end, the third illuminating optical system is selectively controlled into an operative condition by the control means.

Heating means may be provided for post-baking. The heating means may be constituted from, for example, an infrared heater, a microwave heater or an electric heating apparatus which can supply an electric current into the recording plate or the support means thereof, or any other heating apparatus which can heat the recording plate while the recording plate is supported by the support means during the fixing operation and/or after the fixing operation.

In the exposure apparatus of such construction, at least one of the three optical systems including the first and second illuminating optical systems, which are necessary upon recording operation of a hologram, and the third illuminating optical system, which is necessary upon reconstructing operation of an image of the hologram, is selected by the control means, and a fixing light beam can be supplied from the selected optical system to the recording medium layer. Consequently, there is no necessity of providing another optical apparatus for supplying a fixing light beam, and the apparatus is simplified in construction. The recording plate need not be removed from the apparatus for all of a recording operation, a fixing operation and, if necessary, a heating operation of a hologram and a reconstructing operation of the hologram, and all of the processes can be performed while the recording plate is kept at the originally set position. Accordingly, a reconstruction image of the hologram can be reproduced onto the photo-sensitive substrate with a very high degree of accuracy.

The recording medium layer of the recording plate may be constituted from a photo-polymeric film for hologram recording wherein, for example, an additive such as an initiator is added to matrix polymer and monomer which have different refractive indices from each other. The photo-polymeric recording medium layer does not require a so-called developing process after formation of a hologram by exposure and allows fixing process and post-bake process in an on-machine condition. Accordingly, the hologram thus produced need not be replaced to the reconstructing optical system, and there is no possibility of occurrence of an alignment error involved in such replacement. Since deformation or the like of the hologram caused by such replacement can be avoided, a reconstruction image of a high fidelity free from unnecessary noise and aberration can be obtained.

Although the monomer in the photo-polymeric recording medium layer is distributed uniformly in the matrix polymer at an initial stage, as polymerization of the monomer proceeds, the monomer moves to portions, at which exposure has been performed with interference fringes formed by interference between a reference beam and a subject beam, from around there. Accordingly, after recording, the concentration of the monomer increases at exposed portions but decreases at non-exposed portions. As a result, a hologram based on index modulation is formed by a difference in refractive index between the matrix polymer and the monomer. The polymerization of the monomer proceeds simultaneously with irradiation of a light beam upon recording operation, and accordingly, since the hologram is formed on the real time basis, a development process after recording is unnecessary. After such recording operation, in order to polymerize the remaining monomer as it is, a fixing operation wherein light such as ultraviolet rays is irradiated uniformly over the entire area of the hologram is performed. In the present invention, also the fixing operation can be performed in an on-machine condition.

Further, if necessary, the hologram after the fixing process can be heated in an on-machine condition so as to enhance the diffraction efficiency of the hologram and achieve intensification. The enhancement of the diffraction efficiency results in increase of the exposure amount upon formation of a reconstruction image on the photo-sensitive substrate and decrease of the exposure time, and as a result, the throughput of the reproducing and exposure steps is enhanced.

The light beam for the fixing processing may be any of coherent light and incoherent light and must only be light of a wavelength with which the initiator reacts to polymerize the monomer. Since generally the initiator has a high sensitivity in the ultraviolet region, it is effective to use a particular spectral radiation from a mercury lamp or a like light source. Accordingly, when the apparatus includes, in addition to the light source for hologram recording, another light source such as, for example, an incoherent light source for reconstructing a hologram, an incoherent light beam from the incoherent light source may also be utilized as the fixing light beam. Naturally, it is possible to utilize a coherent light beam from the coherent light source for hologram recording operation as the fixing light beam.

In the photo-polymeric recording medium layer described above in which interference fringes can be recorded on the real time basis without the necessity of a wet development process, the reference beam is diffracted by a refraction index distribution (interference fringes) formed in the inside of the recording medium layer upon recording operation, and the intensity of the diffracted light increases as recording of the interference fringes proceeds. Optimization of the exposure amount to the actual recording medium can be achieved by photoelectrically detecting the variation of the intensity of the diffracted light caused on the real time basis during exposure upon the recording operation and controlling the exposure amount in response to the detected intensity variation. In this instance, the intensity of non-diffracted light, which has not been diffracted in but has been transmitted through the recording medium layer, decreases reversely by an amount by which the intensity of the diffracted light increases. Accordingly, even if the intensity of the non-diffracted light is detected and the exposure amount is controlled in response to the intensity thus detected, optimization of the exposure amount can be achieved similarly. Furthermore, it is also possible to detect a difference in intensity between the diffracted light and the non-diffracted light of the reference beam to control the exposure amount, and this can enhance the sensitivity in measurement. Naturally, since also the subject beam undergoes diffraction by the refractive index distribution formed in the recording medium layer, similar optimization control of the exposure amount can be performed by detecting the intensity of diffracted light and/or non-diffracted light of the subject beam in place of the reference beam.

To this end, according to another aspect of the present invention, the exposure apparatus further comprises recording condition detecting means for detecting, upon the recording operation, one of diffracted light and non-diffracted light of the subject beam and/or the reference beam by the recording medium layer to detect a recording condition of the hologram in the recording medium layer.

In order to detect the condition of formation of the refractive index distribution in the recording medium layer (condition of recording of interference fringes), a monitor light beam of a wavelength different from the wavelength of the subject beam and from that of the reference beam can be utilized. Where a monitor beam illuminating optical system for irradiating a monitor light beam of a wavelength different from the wavelength of the subject beam and from that of the reference beam, the recording condition detecting means is adapted to detect, upon the recording operation, either one of diffracted light and non-diffracted light of the monitor light beam by the recording medium layer to detect the recording condition of the hologram in the recording medium layer. The monitor light beam enters the recording plate at such an angle at which the variation in diffraction angle caused by a difference in wavelength between the reference beam and the subject beam is compensated for. If a monitor light beam of a wavelength to which the recording medium layer has no sensitivity is employed, then the monitor light beam can enter the recording medium layer with a high intensity. This allows intensity measurement of the diffracted light to be performed at a stage at which the refraction index difference of the refraction index distribution is small, which is effective on enhancement of the sensitivity in measurement. Further, if a wavelength selection filter is interposed in front of a detector for a monitor light beam, then only diffracted light of the monitor light beam can be detected without being influenced by any light beam for recording such as a reference beam and a subject beam.

Upon recording operation, when optimum exposure conditions cannot be determined by measurement in one exposure operation, an exposure operation in a different condition may automatically be repeated to perform similar measurement to determine optical exposure conditions. Two concrete methods may be applicable. One of the two methods involves division of the exposure area of a single recording plate into a plurality of sections and provision of different exposure conditions to the sections, which corresponds to "exposure matrices" in an ordinary projecting exposure apparatus. This method is suitable when the mask pattern to be recorded is a repeat pattern. In this instance, means for limiting irradiating areas of the reference beam and the subject beam in an interlocking relationship and detecting means for detecting diffracted light in the irradiating areas are required. The other method involves exposure of each recording plate for each one condition in an interlocking relationship with mounting and dismounting of the recording plate and replacement of the recording plate so as to perform exposure of the recording plates in the different conditions to determine optimum exposure conditions. This method is suitable for a mask pattern to be recorded wherein it is constituted from various patterns for which the optimum exposure conditions are individually different from one another since it is necessary to repeat exposure of a pattern and determine general optimum exposure conditions from results of such exposure.

It is to be noted that a time lag may possibly occur between the exposure of the photo-polymeric recording medium layer upon recording operation and formation of a hologram, and also after completion of the exposure, formation of the hologram by movement of the monomer may possibly proceed. Accordingly, attention must be paid to the fact that the optimum exposure amount may not always be provided when the intensity of diffracted light reaches its maximum value.

Subsequently, in the photo-polymeric recording medium layer described above in which interference fringes can be recorded on the real time basis without the necessity of a wet development process, it is necessary to perform, after the recording operation, uniform exposure over the entire area of the hologram to fix the recorded refractive index distribution. The characteristic of the hologram is varied to a great extent also by the exposure amount (illuminance×time) upon the fixing operation. Accordingly, similarly as upon the recording operation described above, in order to determine an optimum exposure amount upon fixing operation, fixing condition detecting means for detecting either one of diffracted light and non-diffracted light of the fixing light beam by the recording medium layer to detect the fixing condition of the hologram in the recording medium layer may be provided.

When, for example, the reference beam used upon recording operation is utilized as a fixing light beam, since a virtual image of the mask pattern is formed by diffracted light by the hologram, the fixing condition can be detected with certainty by measuring the intensity of light of the virtual image. On the other hand, when conjugate light with the reference beam used upon recording operation is used as the fixing light beam, since a real image of the mask pattern is formed by diffracted light by the hologram, the fixing condition can be detected with certainty by measuring the intensity of light of the real image. Also when the subject beam used upon recording operation or a conjugate light beam with the subject beam is used as the fixing light beam, the fixing condition of the hologram can be detected similarly.

Also in measurement of the fixing condition, the intensity of non-diffracted light which has not been diffracted in but have been transmitted through the recording medium layer decreases by an amount corresponding to the increased intensity of the diffracted light. Accordingly, optimization of the exposure amount can be achieved similarly by detecting the intensity of the non-diffracted light and controlling the exposure amount in response to the thus detected intensity. Furthermore, it is also possible to detect a difference in intensity between the diffracted light and the non-diffracted light of the reference beam and control the exposure amount in response to the detected intensity difference, which can enhance the sensitivity in measurement.

Similarly, where a monitor beam illuminating optical system for irradiating a monitor light beam of a wavelength different from the wavelength of the fixing light beam into the recording plate is provided, the fixing condition detecting means detects, upon the fixing operation, either one of diffracted light and non-diffracted light of the monitor light beam by the recording medium layer to detect the fixing condition of the hologram in the recording medium layer.

It is to be noted that it is generally admitted that the fixing efficiency is highest when ultraviolet rays are employed as a fixing light beam. Where the coherent light beam for recording operation is ultraviolet rays, it is advantageous to utilize the coherent light beam as a fixing light beam. When the fixing light beam and the recording beam are different from each other in wavelength, attention must be paid to the fact that the position of a diffraction image produced upon detection of a fixing condition is different from that of the case of the recording beam.

When a post-baking process is performed after the fixing operation, if the hologram formed in the photo-polymeric recording medium layer is heated, then the refractive index difference of the refractive index distribution is increased to raise the diffraction efficiency. Optimum conditions (temperature and time) exist also in the heating process, and overheating will deteriorate the diffraction efficiency conversely. The techniques to achieve optimization of fixing conditions described hereinabove can be applied also to the heating process. In particular, optimum heating conditions can be determined by directing a monitor light beam into the hologram during heating processing and detecting at least one of diffracted light and non-diffracted light of the monitor light beam.

According to a further aspect of the present invention, the second illuminating optical system irradiates, upon the recording operation, the coherent light beam from the coherent light source means as a reference beam into a plane of incidence of the recording plate at such an incident angle at which the reference beam is totally reflected in the inside of the recording plate.

The second illuminating optical system may additionally include polarization converting means for extracting only a linearly polarized light component, which is to make P-polarized light with respect to the plane of incidence of the recording plate, from the coherent light and irradiating the extracted linearly polarized light component as the reference beam into the recording medium layer. In this instance, the reference beam enters the totally reflecting face in the recording plate at the angle of 40 to 50 degrees, preferably 45 degrees. When such reference beam is irradiated upon the recording plate, the incident reference beam and the totally reflected reference beam in the recording medium layer both become P-polarized light, and the directions of oscillations of electric vectors of linearly polarized light of them are both included in the plane of incidence and cross each other. Accordingly, interference fringes by interference between the incident reference beam and the totally reflected reference beam are not formed readily in the recording medium layer.

Analyzing interference fringes formed in a recording medium layer in hologram recording of the total internal reflection holography system, they include, when dividing them roughly, three types of interference fringes including of such fringes Fac formed by interference between an incident reference beam a and a subject beam c as shown in FIG. 8a, such fringes Fbc formed by interference between a totally reflected reference beam b and a subject beam c as shown in FIG. 8b and such fringes Fab formed by interference between an incident reference beam a and a totally reflected reference beam b as shown in FIG. 8c. While the interference fringes Fac and the interference fringes Fbc are shown as interference fringes formed by zero-order diffracted light in FIGS. 8a and 8b, they are actually formed from interference fringes by diffracted light of some other orders overlapping with interference fringes by zero-order diffracted light in accordance with a pattern of an object (mask), and both of the interference fringes Fac and Fbc contribute to reconstruction of a hologram image. Meanwhile, the interference fringes Fab are interference fringes of standing waves formed in parallel to the incident plane in the recording medium layer, and they are an unnecessary component which does not contribute to reconstruction of a hologram image. Therefore, if the existence of the interference fringes Fab of standing waves can be eliminated, then since the amount of loss of light reflected at the interference fringes Fab of standing waves upon reconstruction of the hologram decreases, the amount of light which substantially contributes to reconstruction of an image increases and the efficiency is enhanced.

Particularly when the incident angle of the incident reference beam is substantially equal to 45 degrees and besides crosses perpendicularly with the totally reflected reference beam, since P-polarized light beams of them cross perpendicularly to each other in the recording medium layer, substantial interference does not occur between them, and accordingly, production of interference fringes Fab of standing waves which is inconvenient for later reconstructing operation is prevented.

That is, in such an illuminating condition of the reference beam, only one of interference fringes Fac which is formed by mutual interference between the incident reference beam and the subject beam and interference fringes Fbc which is formed by mutual interference between the totally reflected reference beam and the subject beam is formed in the recording medium layer. Accordingly, recording elements (for example, monomer described hereinabove, grain silver halide or the like) of the recording medium layer are concentrated only upon fringes necessary for reconstruction of an image, interference fringes can be formed efficiently and a high signal-to-noise ratio can be obtained.

Further, if only the second illuminating optical system is, upon the fixing operation, selectively put into an operative condition by the control means so that the reference beam of P-polarized light may be irradiated as the fixing light beam also upon the fixing operation, then since unnecessary standing waves are not formed in the recording medium layer, interference fringes to be fixed can be fixed uniformly over the entire area without deterioration of the signal-to-noise ratio.

When a fixing light beam other than the reference beam of P-polarized light must necessarily be used, it is effective to modulate the phase of the fixing light beam to cause standing waves in the recording medium layer to be oscillated, and irradiation for uniform fixing processing can be realized also by irradiating, as a reference beam, two beams of perpendicularly polarized light, for example, from both of the first illuminating optical system for a subject beam and the second illuminating optical system for a reference beam. This can be realized only by disposing a polarizing element such as a half-wave plate in each of the first and second illuminating optical systems, and no special fixing illuminating optical system is required.

According to a yet further aspect of the present invention, the recording plate includes a light-transmitting protect plate which covers, on the side of one face of the recording plate, over the recording medium layer, and a light-transmitting support member which covers, on the side of the other face of the recording plate, over the recording medium layer. The protect plate provides an optically substantially flat first incident plane for the subject beam substantially parallel to the recording medium layer on the one face of the recording plate, and the support member provides an optically substantially flat second incident plane for the reference beam on the other face of the recording plate. Thus, the reference beam which enters the second incidence plane at the incident angle is totally reflected at the inner face of the first incident plane. Each of the protect plate and the support member has a refractive index substantially equal to that of the recording medium layer held between them, and they are substantially transparent for the reference beam, the subject beam, the fixing light beam and the reconstructing beam and have a mechanical strength sufficient to maintain the flatness of the recording medium layer. Preferably, the recording plate further includes an antireflection film for the subject beam provided on the outer face of the first incident plane of the protect plate.

In the recording plate of such construction, since the recording medium layer is held at the opposite faces thereof between the support member and the protect plate, it is enclosed and protected from the external world so that it is prevented from being deteriorated in quality by a substance from the outside. Further, such an exposure face at which shrinkage occurs upon fixing operation is eliminated.

Further, since the flatness of the lower face of the recording medium layer is not necessarily be assured, if total internal reflection of the reference beam occurs there, then even if the incident reference beam is a plane wave, the totally reflected light will be an incomplete plane wave. When a hologram recorded under the presence of such reference light beam is reconstructed from a reconstructing light beam of a plane wave, then this means that the hologram is reconstructed from a light beam which is not conjugate with the reference beam used upon recording, and consequently, a noise component is included in an image of the mask pattern thus obtained. In contrast, in the present invention, since internal reflection of the reference beam occurs on the inner side of the first incident plane of the protect plate placed on the recording plate and having a good flatness and the first incident plane of the protect plate is an optically substantially flat plane, if the incident reference beam is a plane wave, then also the totally reflected light beam is a plane wave which is superior in flatness free from disorder at the wave front. Accordingly, the accuracy of the hologram formed by interference between the totally reflected reference beam and the subject beam upon recording operation is enhanced. Also when a conjugate plane wave beam with the incident reference beam enters the recording plate upon reproducing operation, since the plane accuracy of the total internal reflection face is high, the strain of the reconstructed image is reduced and a good image free from noise can be formed on the photo-sensitive substrate.

The antireflection film prevents reflection of the subject beam irradiated by way of the mask, and accordingly, multiple reflection between the first incident plane and the surface of the mask is reduced. The antireflection film is formed on the first incident plane of the protect plate which is superior in flatness, and consequently, good flatness of the boundary of the antireflection film from the air is obtained. Therefore, even if the reference beam is totally internally reflected at the boundary, the wave front of the totally reflected reference beam is not disturbed at all.

Preferably, the support member is constituted by a kind of prism. In this instance, the recording medium layer is supported on a first face of the prism while a second face of the prism which extends obliquely to the first face forms the second incident plane.

According to a yet further aspect of the present invention, the recording medium layer of the recording plate has a spatial frequency recording characteristic wherein it exhibits a recording sensitivity only in a spatial frequency band either of interference fringes formed by interference between the reference beam entering the recording plate and the subject beam or of interference fringes formed by interference between the reference beam totally reflected in the recording plate and the subject beam.

While interference fringes formed in a recording medium layer in hologram recording of the total internal reflection holography system are divided roughly into such three kinds as shown FIGS. 8a, 8b and 8c as described hereinabove, an outline of distributions of spatial frequencies of the interference fringes Fac, Fbc and Fab is such as illustrated in FIG. 9. Each of the interference fringes Fac and Fbc has a band extent corresponding to a spatial frequency band of a subject beam, and the value of its bandwidth$\Delta$ fc corresponds to a maximum diffraction angle $\pm\alpha$ of the subject beam. When the object or the pattern of the mask is a regular pattern, the distribution then is such a discrete distribution corresponding to the number of orders of diffraction as indicated by broken lines in FIG. 9. It is a matter of course that the interference fringes Fab formed by mutual interference between the incident reference beam a and the totally reflected reference beam b do not have a band extent anyway.

Interference fringes formed, recorded and stored in the recording medium layer having a recording sensitivity only to the selected spatial frequency band as described above are either one of interference fringes Fac formed by interference between the subject beam and the incident reference beam and interference fringes Fbc formed by interference between the subject beam and the totally internally reflected reference beam. Accordingly, since light beams for forming interference fringes can be concentrated upon one frequency band, the diffraction efficiency of a hologram can be raised.

Such spatial frequency recording characteristic can be selected by the composition of the photo-polymeric material constituting the recording medium. Where a recording medium having such recording characteristic is used, it is particularly preferable that the second illuminating optical system include polarization converting means for extracting only a linearly polarized light component, which is to make P-polarized light with respect to the plane of incidence of the recording plate, from the coherent light and irradiating the extracted linearly polarized light component as the reference beam into the recording medium layer. In this instance, the reference beam enters the totally reflecting face in the recording plate at the angle of 40 to 50 degrees, preferably 45 degrees.

According to a yet further aspect of the present invention, there is provided an exposure apparatus for reproducing a pattern of a mask on a photo-sensitive surface of a substrate using holographic techniques, comprising:

a hologram recording plate provided with a photo-polymeric recording medium layer in which a hologram can be recorded by a photochemical reaction;

coherent light source means for generating a coherent light beam;

support means adapted to hold the recording plate at a predetermined position both upon recording operation for forming a volume hologram in the recording plate and upon reconstructing operation for forming an image of the thus formed hologram;

a first illuminating optical system for introducing, upon the recording operation, the coherent light beam from the coherent light source means to the mask disposed in a spaced relationship from the recording plate with a predetermined gap left therebetween and for irradiating a subject beam produced from the mask then into the recording medium layer of the recording plate from the side of one surface of the recording plate by way of the gap;

a common illuminating optical system for irradiating, upon the recording operation and upon the reconstructing operation, the coherent light beam from the coherent light source means into the recording plate from the side of the other surface of the recording plate so that the coherent light beam may be totally reflected in the inside of the recording plate;

means for disposing, upon the reconstructing operation, the substrate at the position of the mask in place of the mask; and a reflecting optical system for returning, upon the reconstructing operation, the coherent light beam irradiated from the common illuminating optical system in the opposite direction into the original optical path after total reflection of it in the inside of the recording plate so that the coherent light beam may be irradiated as a phase-conjugate reconstructing reference beam into the recording plate, in which a volume hologram corresponding to the pattern has been recorded by the recording operation, to form an image of the hologram on the photo-sensitive surface of the substrate.

The reflecting optical system can be constituted from a phase-conjugate mirror, and preferably, the phase-conjugate mirror is disposed for displacement into and out of the optical path of the totally reflected light beam.

The reconstructing reference beam reflected from the phase-conjugate mirror does not include a wave front component different from that of the reference beam used upon recording since it is a phase-conjugate beam with the reference beam used upon the recording operation, and accordingly, the reconstructing beam returning the original optical path and entering the hologram is diffracted (in the case of a volume hologram, Bragg diffraction) by the hologram and is returned to the original exit point with fidelity. The diffraction efficiency and the resolution are enhanced in this manner, and meanwhile, exposure irregularities upon reconstruction are reduced.

Since the phase-conjugate mirror has a nature of returning reflected light back in the same direction as the incident direction, occurrence of an alignment error of the reconstructing light beam in the incident direction upon reconstructing operation can be prevented only by storing the arrangement of the illuminating optical system for a reference beam upon the recording operation.

According to a yet further aspect of the present invention, there is provide an exposure apparatus for reproducing a pattern of a mask on a photo-sensitive surface of a substrate using holographic techniques, comprising:

a hologram recording plate provided with a photo-polymeric recording medium layer in which a hologram can be recorded by a photochemical reaction;

coherent light source means for generating a coherent light beam;

support means adapted to hold the recording plate at a predetermined position both upon recording operation for forming a volume hologram in the recording plate and upon reconstructing operation for forming an image of the thus formed hologram;

a first illuminating optical system for introducing, upon the recording operation, the coherent light beam from the coherent light source means to the mask disposed in a spaced relationship from the recording plate with a predetermined gap left therebetween and for irradiating a subject beam produced from the mask then into the recording medium layer of the recording plate from the side of one surface of the recording plate by way of the gap;

a common illuminating optical system for irradiating, upon the recording operation and upon the reconstructing operation, the coherent light beam from the coherent light source means into the recording plate from the side of the one surface of the recording plate along an optical path along which the coherent light beam is transmitted through the recording medium layer;

means for disposing, upon the reconstructing operation, the substrate at the position of the mask in place of the mask; and a reflecting optical system for returning, upon the reconstructing operation, the coherent light beam irradiated from the common illuminating optical system in the opposite direction into the original light path after transmission of it through the recording plate so that the coherent light beam may be irradiated as a phase-conjugate reconstructing reference light beam into the recording plate, in which a volume hologram corresponding to the pattern has been recorded by the recording operation, to form an image of the hologram on the photo-sensitive surface of the substrate.

Also in this instance, the reflecting optical system can be constituted from a phase-conjugate mirror, and preferably, the phase-conjugate mirror is disposed for displacement into and out of the optical path of the totally reflected light beam.

According to a yet further aspect of the present invention, there is provided an exposure apparatus for reproducing a pattern of a mask on a photo-sensitive surface of a substrate using holographic techniques, comprising:

a hologram recording plate provided with a photo-polymeric recording medium layer in which a hologram can be recorded by a photochemical reaction;

coherent light source means for generating a coherent light beam;

light beam separating means for separating the coherent light from the coherent light source means into first and second light beams in a vertical plane;

a prism having a first plane which holds one surface of the recording plate horizontally at a predetermined position both upon recording operation for forming a volume hologram in the recording plate and upon reconstructing operation for forming an image of the hologram thus formed, a second plane extending obliquely to the first plane, and a third plane extending obliquely to the first and second planes;

a first illuminating optical system for introducing, upon the recording operation, the first light beam in the vertical plane to the mask disposed in a spaced relationship from the recording plate with a predetermined gap left therebetween and irradiating a subject beam produced from the mask then into the recording medium layer of the recording plate from the side of the other surface of the recording plate by way of the gap;

a second illuminating optical system for introducing, upon the recording operation, the second light beam as a reference beam in the vertical plane to the second plane of the prism so that the reference beam introduced to the second plane of the prism may be transmitted through the prism and reach the inside of the recording plate on the first plane of the prism whereafter it is totally internally reflected on the one surface side in the recording medium layer and besides both of the incident reference beam and the totally reflected reference beam may interfere in the recording medium layer with the subject beam to form interference fringes;

means for disposing, upon the reconstructing operation, the substrate at the position of the mask in place of the mask; and a third illuminating optical system for irradiating, upon the reconstructing operation, a conjugate beam with the reference beam used upon the recording operation into the recording plate, in which a volume hologram corresponding to the pattern has been formed by the recording operation, to form an image of the hologram on the photo-sensitive surface of the substrate.

In this exposure apparatus, the first illuminating optical system for a subject beam and the second illuminating optical system for a reference beam are disposed in the same vertical plane, and a light beam from the light source is split into a subject beam and a reference beam in the vertical plane. The arrangement provides a construction advantageous in stable support of the recording plate particularly for the necessity for arranging the recording plate horizontally on the prism by way of index matching liquid. In particular, in a conventional popular arrangement of a light beam splitting optical system wherein a light beam from a light source is split within a horizontal plane, in order to irradiate a subject beam in a longitudinal direction upon the recording plate supported horizontally and irradiate a reference beam obliquely upon the recording plate so that the reference beam may cross with the subject beam in the recording plate, the light beam introduced horizontally must necessarily be raised upwardly. Consequently, a plurality of optical paths are directed three-dimensional directions, which complicates the optical systems and makes alignment of light beams difficult.

In contrast, in the exposure apparatus of the present invention which is adapted to split and introduce a light beam from the light source in the vertical plane, it can be constructed such that the optical paths of a subject beam and a reference beam may pass in the same vertical plane, and consequently, the arrangement and construction of the optical systems can be simplified. Further, also alignment of light beams can be performed efficiently with a high degree of accuracy with reference to the vertical plane within which the subject beam and the reference beam are split from each other. Further, the optical systems can be arranged in the same plane and supported on a single support structure, and consequently, even if vibrations are transmitted from some vibration source to the support structure, the entire optical systems of the exposure apparatus are vibrated similarly. As a result, local vibrations do not have a significant influence on the optical systems. Further, since the area occupied by the exposure apparatus in a horizontal plane can be reduced remarkably, a series of process systems wherein a plurality of exposure apparatus and various processing apparatus are connected can be arranged efficiently in a limited floor area.

Preferably, the light beam separating means is constituted, for example, from a polarizing beam splitter which produces the first light beam and the second light beam which have different polarized conditions from each other.

Each of the first illuminating optical system and the second illuminating optical system may additionally include polarizing means for controlling a polarization condition of an irradiating light beam.

The prism is constituted from a substantially rectangular prism having the first plane of a comparatively small length, the second plane comparatively longer than the first plane, and the third plane extending perpendicularly to the first plane. The first plane and the third plane have a substantially same length, and consequently, the reference beam enters the second plane perpendicularly to the latter.

The second illuminating optical system and the third illuminating optical system may be replaced with a single common illuminating optical system having functions of them. The common illuminating optical system includes beam shaping means for shaping the second light beam into a parallel light beam parallel to the vertical plane and irradiating the parallel light beam into the second plane of the prism, and optical path selecting means for selectively changing over the parallel light beam to enter a first defined portion of the second plane of the prism or a second defined portion different from the first defined portion. Upon the recording operation, the parallel light beam enters, as the reference beam, only the first portion, but enters, upon the reconstructing operation, as the reconstructing light beam, only the second portion. In this instance, where the prism is constituted from a substantially rectangular prism, the optical path selecting means can be constituted from selectively operable shutter means for selectively intercepting the partial parallel light beam on each side of the parallel light beam with respect to the center of the optical axis of the parallel light beam.

The first illuminating optical system may include an observation optical system mounted for movement between an observation position and a shunt position for observing the hologram formed in the recording medium layer or a reconstruction image of the hologram.

For supporting the mask or the substrate on the other surface of the recording plate with the gap, a spacer having a predetermined thickness may be provided on said other surface of the recording plate by, for example, photolithography techniques.

The above and other objects, features and advantages of the present invention will become apparent from the following description of several preferred embodiments of the present invention, which are shown as mere examples and do not intend any restriction, taken in conjunction with the accompanying drawings.

DESCRIPTION OF THE PREFERRED EMBODIMENTS

Figure 1:
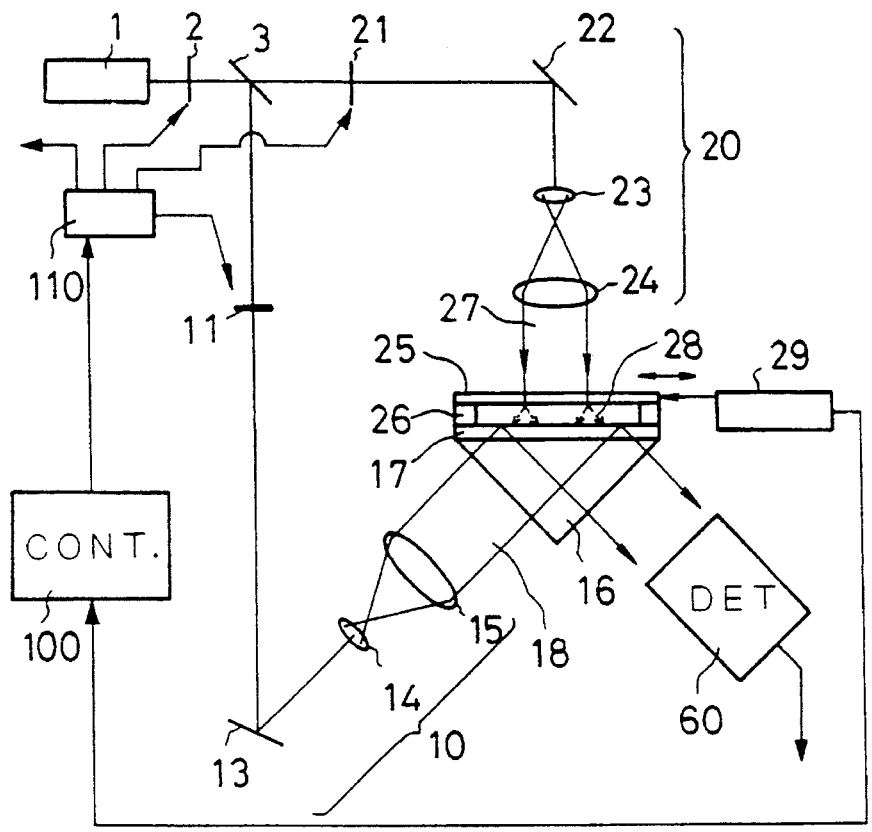
FIG. 1 shows an example of configuration of a basic optical system necessary upon recording operation of an exposure apparatus according to a first embodiment of the present invention.
Figure 2:
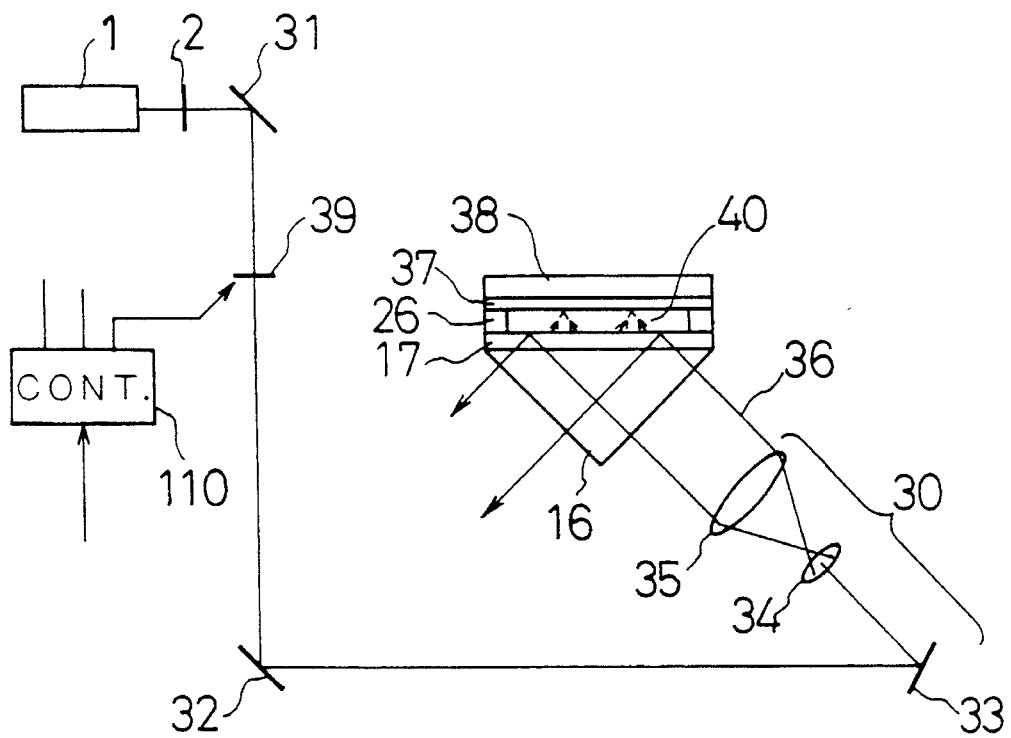
FIG. 2 shows an example of configuration of a basic optical system necessary upon reconstructing operation of the exposure apparatus according to the first embodiment.

Referring first to FIGS. 1 and 2, there is shown an exposure apparatus according to a first embodiment of the present invention. The exposure apparatus includes a hologram recording plate 17 provided with a photo-polymeric recording medium layer in which a hologram can be recorded by a photochemical reaction. The hologram recording plate 17 is supported horizontally on a plane which includes a major side of a rectangular prism 16.

In order to facilitate understanding of functions upon recording operation and reconstructing operation, in the accompanying drawings, principal construction of the exposure apparatus is shown separately in FIG. 1 for recording operation and in FIG. 2 for reconstructing operation. It is to be noted, however, that all features shown in FIGS. 1 and 2 are provided in the single exposure apparatus.

In particular, the present exposure apparatus includes, as shown in FIGS. 1 and 2, a laser light source 1 serving as coherent light source means, the hologram recording plate 17, the prism 16 serving as support means for holding the recording plate 17 at a predetermined position during recording operation and reconstructing operation, a first illuminating optical system 20 for introducing, upon reproducing operation, a coherent light beam 27 from the laser light source 1 to a mask 25 disposed with a predetermined gap left from the recording plate 17 thereby to irradiate a subject beam 28 outputted from the mask 25 into the recording medium layer of the recording plate 17 by way of the gap, a second illuminating optical system 10 for irradiating, upon recording operation, the coherent light beam from the laser light source 1 as a reference beam 18 upon the recording plate 17 so that interference fringes with the subject beam 28 may be formed in the recording medium layer of the recording plate 17, carrier means 29 for disposing, upon reconstructing operation, a photo-sensitive substrate 38 such as a silicon wafer, to which a photoresist 37 is applied, to the position of the mask 25 in place of the mask 25, a third illuminating optical system 30 for irradiating, upon reconstructing operation, a conjugation light beam 36 with the reference beam 18 used upon recording operation upon the recording plate 17, onto which a volume hologram corresponding to the pattern of the mask has been formed by the recording operation described above, to form an image of a hologram on the resist 37 of the photo-sensitive substrate 38, a pair of control apparatus 100 and 110 for controlling the first illuminating optical system 20, the second illuminating optical system 10 and the third illuminating optical system 30 to put an at least selected one of them into an operative condition so as to irradiate a fixing light beam from the selected optical system into the recording plate 17 held by the prism 16 in order to fix the hologram formed in the recording plate 17 by the recording operation, and a plurality of shutters 2, 11, 21 and 39 controlled to be opened or closed by the control apparatus 100 and 110.

A recording operation will be described first. Referring to FIG. 1, a coherent light beam generated by the laser light source 1 is transmitted through the shutter 2 and split into two light beams by a beam splitter 3. One of the split light beams is introduced to the second illuminating optical system 10 by way of the shutter 11. The coherent light source emerging from the shutter 11 is reflected by a mirror 13 of the second illuminating optical system 10 and then converted into a parallel light beam of a predetermined width by a beam expander including a pair of lenses 14 and 15, whereafter it enters, as a reference beam 18, the prism 16 by way of a left-hand side downwardly inclined face in FIG. 1 and is irradiated upon the recording plate 17. The reference beam 18 is transmitted through the prism 16 and enters the recording plate 17, in which it is totally reflected at the inner face of the boundary of the recording plate 17 from the air on the upper face side of the recording plate 17. The totally reflected light beam passes the inside of the recording plate 17 again and emerges from the right-hand side downwardly inclined face in FIG. 1 of the prism 16. The emergent totally reflected light beam is measured in intensity by a detector 60, which is retracted from the optical path upon reconstructing operation.

The other coherent light source split by the beam splitter 3 is introduced into the first illuminating optical system 20 by way of the shutter 21. The coherent light beam emerging from the shutter 21 is reflected by a mirror 22 of the first illuminating optical system 20 and then converted into a parallel light beam of a sectional area necessary to irradiate upon a pattern face of a mask 25 by a beam expander including a pair of lenses 23 and 24. The mask 25 is held in parallel to the recording plate 17 with a predetermined gap left therebetween by a spacer 26. As a result of such irradiation, transmitted and diffracted light conforming to the pattern of the mask 25 is produced from the mask 25 and is irradiated as a subject beam 28 downwardly into the recording plate 17.

With the exposure apparatus of such construction as described above, when all of the shutters 2, 11 and 21 are open, the reference beam 18 and the subject beam 28 interfere with each other so that interference fringes are formed in the recording plate 17. Where a photo-polymeric material which does not require a developing process is used for the recording medium 17, a hologram can be formed on the real time basis in the recording medium layer. Optimization of the exposure amount upon recording of a hologram is achieved, as hereinafter described in detail, by performing opening and closing control of the shutters by the control apparatus 100 and 110 based on a result of measurement of the detector 60 such that the shutters are opened only for a time necessary for formation of a hologram and then closed when a predetermined exposure amount is reached.

After formation of the hologram, the mask 25 is removed from the mask carrier means 29, and then only the shutters 2 and 21 are opened while the shutter 11 is kept closed. Consequently, mask illuminating light 27 from the first illuminating optical system 20 can be irradiated as a fixing light beam upon the recording plate 17. On the other hand, if the shutter 21 is closed while the shutters 2 and 11 are open, then a light beam from the second illuminating optical system 10 (which passes the same optical path as the reference beam 18) can be irradiated as a fixing light beam upon the recording plate 17.

Such control of the shutters 2, 11 and 21 is performed by way of the shutter control apparatus 110, and linkage between a movement of the mask by the mask carrier means 29 and an operation of a movement of a wafer is controlled by the control apparatus 100.

By the way, when a fixing light beam is irradiated from the second illuminating optical system 10, since the fixing light beam is totally reflected at the inner face (upper side boundary) of the recording plate 17, there is the possibility that standing waves may be produced in the recording plate 17 as a result of mutual interference between the incident fixing light beam and the totally reflected fixing light beam and the fixing light beam may not provide uniform irradiation due to an influence of the standing waves. Therefore, a wavelength plate 12 for converting a light beam entering the recording plate 17 from the second illuminating optical system 10 into P-polarized light which oscillates in its incidence plane (plane of FIG. 1) should be disposed in the second illuminating optical system 10 so that the incidence angle of a fixing light beam to the recording plate 17 may be equal to 45 degrees as shown in FIG. 1 to prevent formation of such standing waves as described above to achieve uniform irradiation of the fixing light beam over the entire area.

As another measure, the phase of a light beam may be modulated in the second illuminating optical system 10 by a modulating element, or a fixing light beam entering the recording plate 17 may be oscillated over a very small angle or displaced by a very small amount by an optical oscillating element not shown so that formation of such standing waves as described above may be prevented thereby to achieve uniform exposure of fixing light over the entire area.

It is also effective to convert a fixing light beam irradiated from the first illuminating optical system 20 and a fixing light beam irradiated from the second illuminating optical system 10 into polarized light beams having perpendicular polarization planes to each other using the wavelength plate 12 so that the two fixing light beams may not cause mutual interference. In this instance, even if the two light beams from the two illuminating optical systems 10 and 20 are irradiated simultaneously on the recording plate 17 to effect a fixing process, it is possible to prevent occurrence of standing waves from a fixing light beam and effect uniform fixing exposure over the entire area.

It is to be noted that, when a fixing process is to be performed using the first illuminating optical system 20, if the mask 25 is kept disposed in position while a fixing process is performed with a light beam having transmitted through the mask 25, then fixing can be performed only with the transmitted light beam corresponding to the mask pattern. In this instance, since no surplus noise light is produced at all, there is an advantage in that a fixing process can be performed without deterioration of the signal-to-noise ratio of the hologram formed in the recording plate 17.

In the present embodiment, a fixing light beam need not have the same wavelength as that of light for hologram recording if it is generated from the same light source as the hologram recording light. Upon fixing processing, if a light beam of a wider wavelength band than that used upon fixing processing is irradiated upon the recording plate, then the light intensity can be raised, and the fixing process can be completed in a time reduced as much.

Upon the recording plate 17 to which a fixing process has been performed in this manner, a conjugate light beam with the reference beam 18 is irradiated from the third illuminating optical system 30 as a reconstructing beam 36 as shown in FIG. 2 so that reconstruction light 40 is produced from the hologram, and the reconstruction light 40 forms a same reconstructed pattern image as the mask pattern at the same position as the mask 25. Then, a wafer 38 is disposed exchangeably to the same position as the mask 25 by the mask carrier means 29, and the reconstructing beam 36 is irradiated from the third illuminating optical system 30 upon the wafer 38 to reproduce the reproduced mask pattern onto the resist layer 37 on the wafer 38.

Referring now to FIG. 2, a laser light beam from the laser light source 1 is introduced into the third illuminating optical system 30 by mirrors 31, 32 and 33 by way of the shutter 2. In the third illuminating optical system 30, the laser light beam is converted into a parallel light beam of a desired sectional area by a beam expander including a pair of lenses 34 and 35 and then enters the recording plate 17 as a reconstructing beam 36 which is a conjugate light beam with the reference beam 18 upon hologram recording operation. In the recording plate 17, the reconstructing beam 36 is diffracted by the hologram so that reconstruction light 40 is produced. The reconstruction light 40 forms a real image of the pattern on the resist layer 37 applied over the surface of the wafer 38 so that the pattern of the mask 25 is reproduced onto the resist layer 37.

Prior to the reconstructing operation described above, a fixing operation may be performed uniformly over the entire area of the hologram making use of the reconstructing beam 36 from the third illuminating light source 30. In the fixing process of the present case, the wafer 38 may or may not be disposed on the spacer 26.

As the light beam 36 for reconstructing operation, a light beam having a same wavelength as that of a reference beam upon recording operation is used in most cases, but upon fixing processing, the light beam 36 need not have the same wavelength as that of a reference beam for recording operation, and a light beam of any of a large number of oscillation wavelengths from the laser light source 1 can be used. For example, when the laser light source 1 is an argon laser which generates oscillation light including a plurality of wavelength components, a light beam of the wavelength of 514.5 nm is used as a light source beam for a reference beam and a subject beam for recording operation while a light beam of the same wavelength of 514.5 nm or another light beam of the wavelength of 488 nm or else a further light beam of the wavelength of 364 in the ultraviolet region, with which a higher efficiency can be obtained, may be used as a fixing light beam. It is to be noted that, when the light source beam upon recording operation is a light beam of the wavelength of 364 nm, it is optimal to employ a light beam of the same wavelength as that of a fixing light beam.

While the single laser light source 1 in the embodiment of FIGS. 1 and 2 is used commonly for all operations of recording, fixing and reconstruction of a hologram, it is otherwise possible to employ a different light source for reconstructing and fixing operations from a light source for recording operation.

Figure 3:
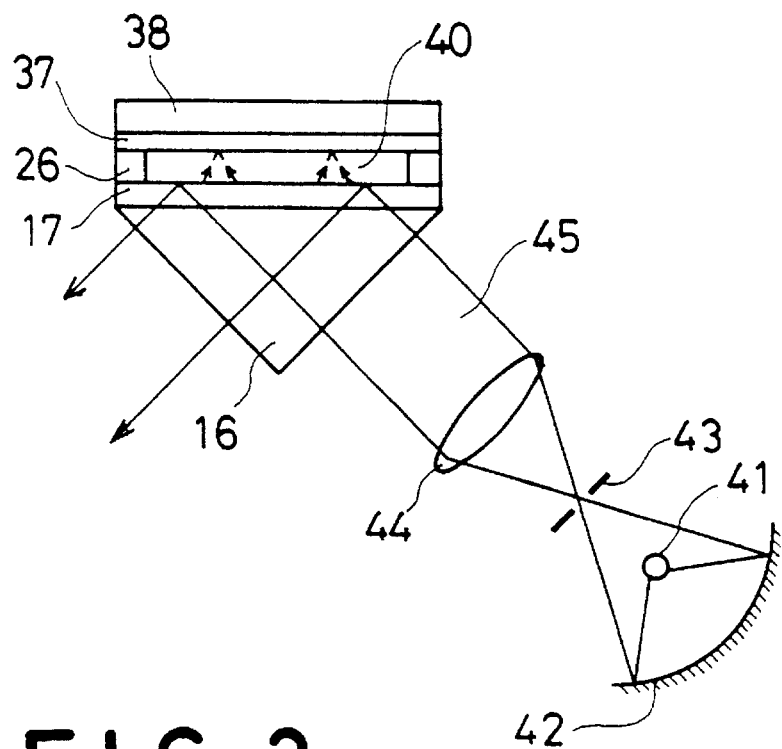
FIG. 3 shows another example of configuration of a basic optical system necessary upon reconstructing operation of the exposure apparatus according to the first embodiment.

FIG. 3 shows a modification to the exposure apparatus wherein another light source for producing an incoherent light beam is provided additionally for a reconstructing operation and a fixing operation. Referring to FIG. 3, same reference numerals as those of FIGS. 1 and 2 denote same or corresponding elements. Where the recording plate 17 has a recording medium layer of a sufficient thickness and a volume hologram is recorded in the recording medium layer, a reconstructing operation and a fixing operation can be performed with an incoherent light beam 45 from a mercury lamp 41.

In a reconstructing operation, a light beam from the mercury lamp 41 is converged by a concave mirror 42 such as an ellipsoidal mirror, transmitted through a pinhole 43 disposed at a convergent point and then converted into a parallel light beam of a desired sectional area by a collimator lens 44. The parallel light beam enters, as a reconstructing beam 45, the recording plate 17 by way of the prism 16. In this instance, the third illuminating optical system for a reconstructing beam, is constituted from the concave mirror 42 for converging a light beam from the mercury lamp 41, the pinhole 43 disposed at the convergent point of the light beam from the concave mirror 42, and the collimator lens 44 for collimating the light beam from the pinhole 43 into a parallel light beam.

A reconstruction image of the hologram can be formed on the resist layer 37 on the wafer 38 with the incoherent light beam 45 from the illuminating optical system described just above. It is also possible to obtain, making use of the light beam 45, uniform irradiation with an intensity sufficient to perform a fixing operation for a hologram. In this instance, the wafer 38 may or may not be disposed during a fixing operation.

Where a light source which produces an incoherent light source is provided, it is preferable to select, upon reconstructing operation, only a wavelength component or components near to the wavelength of a reference beam for recording to form a reconstructing beam using, for example, a filter. However, upon fixing operation, it is possible to perform a fixing operation with a light beam of a high intensity having a wide wavelength band without employing such a filter.

In order to heat the hologram recording plate 17, for which recording and fixing operations have been performed, to achieve enhancement of the diffraction efficiency of the same, while it is a conventional practice to remove the recording plate from the apparatus and heat it in an oven or a like equipment, according to the exposure apparatus of the present embodiment, such post-baking processing can be performed in an on-machine condition without removing the recording plate.

Figure 4:
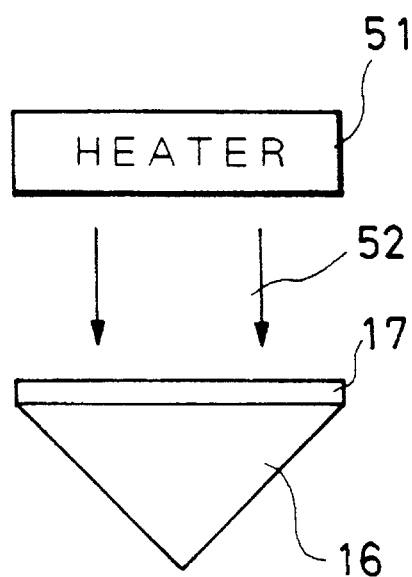
FIG. 4 shows an example of configuration of a heating apparatus necessary upon post-baking of the exposure apparatus according to the first embodiment.

FIG. 4 diagrammatically shows an arrangement of a heating apparatus. A post-baking operation is performed by disposing a heating apparatus 51 in an opposing relationship to the recording plate 17 left supported on the prism 16 and heating the recording plate 17 uniformly over the entire area with radiations 52 from the heating apparatus 51. For example, an infrared radiation generating apparatus which generates infrared radiations may be employed for the heating apparatus 51. Alternatively, a microwave generating apparatus may be employed for the heating apparatus 51. In this instance, shields are provided to necessary locations so that microwaves may not act upon any other location than the hologram. Microwave radiation from the microwave generating apparatus acts upon the recording plate 17 to heat it so that a necessary fixing process is performed. A further form of the heating apparatus 51 is heating by energization of the recording plate. In this instance, a transparent conductive film is provided on the recording plate 17 and is energized to heat the recording plate 17. A still further form may be adopted wherein a heating wire or film is built in the recording plate or a supporting member for the recording plate and is energized so as to generate heat. The wire in this instance should have a sufficiently small thickness so that light may not be scattered by it.

Figure 6:
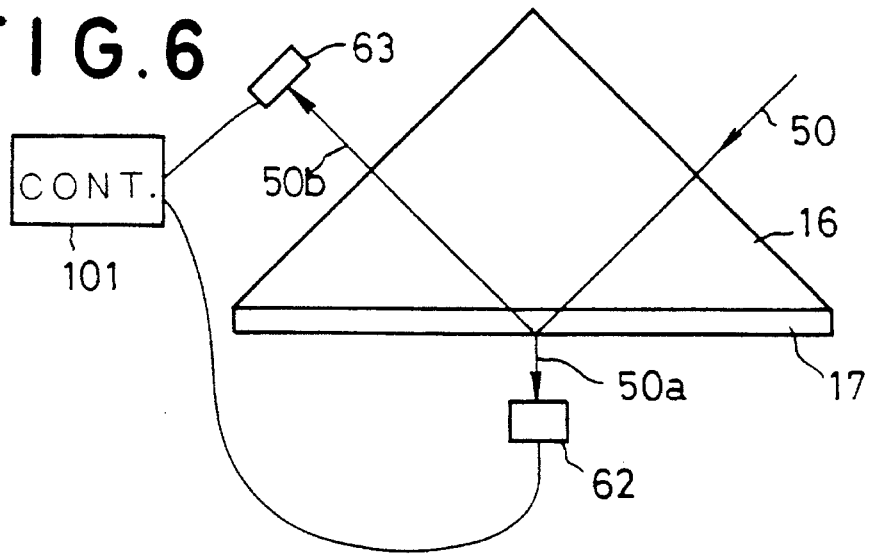
FIG. 6 shows an example of configuration of an exposure amount detecting and controlling system upon fixing operation of the exposure apparatus according to the first embodiment.

Referring back to FIG. 1, a detector 60 is disposed so as to detect the intensity of a light beam emerging from the right-hand side downwardly inclined face in FIG. 6 of the prism 16 in order to allow control for optimization of the exposure amount upon recording operation. As described hereinabove, a reference beam 18 transmitted through the prism 16 and introduced into the recording plate 17 is totally reflected by the inner face of the boundary of the recording plate 17 from the air on the upper face side of the recording plate 17. Of the totally reflected light beam, light (non-diffracted light) which has not been diffracted by interference fringes being formed in the recording medium layer in the recording plate 17 passes through the prism 16 and emerges from the right-hand side downwardly inclined face in FIG. 1 of the prism 16o The intensity of the non-diffracted light decreases as formation of the hologram in the recording plate 17 proceeds. The detector 60 detects the intensity of the non-diffracted light, and a forming condition (recording condition) of the hologram is detected based on a variation of the intensity by the control apparatus 100.

Where the diffraction efficiency of the hologram at a certain time t is represented by $\eta(t)$, the intensity IR(t) of the non-diffracted light then has a relationship given by the following equation (1) to the intensity IR(O) at the time when no hologram is formed as yet (t=0):

$$IR(t)=IR(O)\times[1-\eta(t)] \quad (1)$$

Diffracted light of the subject light 28 which is produced by diffraction by the hologram then is produced in the same direction as that of the non-diffracted light of the reference beam, and the diffraction efficiency is given similarly by $\eta(t)$. Consequently, the intensity IO(t) of the diffracted light of the subject beam at the time t has a relationship to the intensity IO(O) at the time when no hologram is formed as yet given by the following equation (2):

$$IO(t)=IO(O)\times\eta(t) \quad (2)$$

The light intensity I(t) detected by the detector 60 is given as a sum of the intensities of the non-diffracted light of the reference beam and the diffracted light of the subject beam by the following equation (3):

$$\begin{aligned}I(t) &= IR(t)+IO(t) \\ &= IR(O)\times[1-\eta(t)]+IO(O)\times\eta(t)\end{aligned} \quad (3)$$

As described hereinabove, the intensity of non-diffracted light of the reference beam decreases as formation of the hologram proceeds, but the intensity of non-diffracted light of the subject beam increases as formation of the hologram proceeds. In particular, the first term in the right member of the equation (3) decreases gradually while the second term increases gradually.

Consequently, in order to raise the measurement sensitivity, it is preferable to detect the forming condition of a hologram by means of a detector using a monitor light beam having a different wavelength from the wavelength or wavelengths of the reference beam and the subject beam.

Further, while only the sum of intensities of non-diffracted light of a reference beam and diffracted light of a subject beam is considered in the equation (3) above, actually the two light beams may possibly interfere with each other, and in this instance, it is necessary to take the relationship in phase between the two light beams into consideration. It is considered that, since ideally the relationship in phase is always kept fixed between a reference beam and a subject beam, it does not matter, but if the average refractive index of the hologram varies during exposure upon recording operation, then the relationship in phase also varies and has an increasing influence. In such an instance, the detector 60 may also be used to detect a variation of the relationship in phase between the non-diffracted light of the reference beam and the diffracted light of the subject beam thereby detecting a condition of the hologram formation.

In one of available methods for separating the non-diffracted light of the reference beam and the diffracted light of the subject beam, the intensity of the diffracted light of the subject beam is measured while the shutter 11 is closed to temporarily cut the reference beam during exposure. If the closed period of the shutter 11 is sufficiently short comparing with the exposure time, then the influence of it upon the exposure is low. Another method of measuring the intensity of the non-diffracted light of the reference beam while the shutter 21 is temporarily closed may naturally be employed. It is also possible to measure the intensity of the non-diffracted light of the subject beam or the diffracted light of the reference beam by a similar method.

Figure 5:
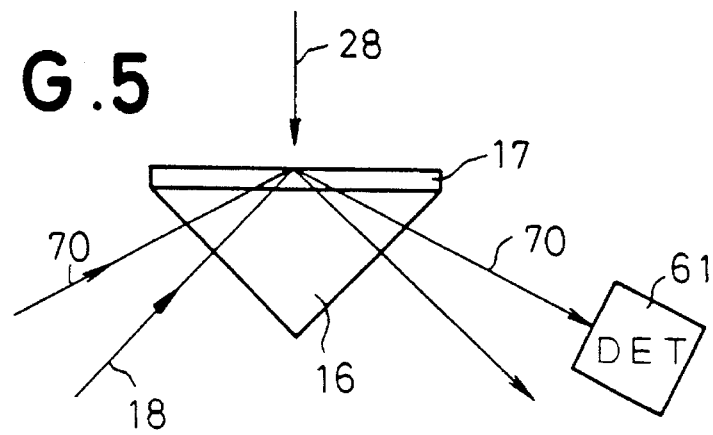
FIG. 5 shows an example of configuration of an exposure amount detecting system upon recording operation of the exposure apparatus according to the first embodiment.

Now, an example for detecting a forming condition of a hologram by means of a monitor light beam having a different wavelength from that of the reference beam will be described with reference to FIG. 5. In FIG. 5, same reference numerals to those of FIGS. 1 and 2 denote corresponding elements, and the monitor light beam 70 having a different wavelength from that of the reference beam 18 is introduced from obliquely upwardly to the left-hand side downwardly inclined face of the prism 16. The incident angle of the monitor light beam 70 is set in accordance with a difference of the wavelength of it from that of the reference beam 18.

The monitor light beam entering the prism 16 is totally internally reflected at the inner face (upper side boundary) of the recording plate 17 and then partially diffracted by the hologram. A non-diffracted component (non-diffracted light) of the monitor light beam 70, which has not been diffracted by the hologram, passes through the recording plate 17 and then exits from the opposite side inclined face of the prism 16 to a detector 61. In this instance, since the non-diffracted light of the reference beam and the diffracted light of the subject beam 28 exit at different angles from that of the monitor light beam 70, only the non-diffracted light of the monitor light beam 70 can be detected. Further, if a wavelength selecting filter is provided in front of the detector 61, then even if the separation angles of the monitor light beam from the reference beam and the subject beam are small, only the monitor light beam 70 can be detected without being influenced by the reference beam and the subject beam.

Accordingly, if a monitor light beam of a wavelength different from those of a reference beam and a subject beam is used and non-diffracted light of the monitor light beam is detected as seen from FIG. 5, then the intensity of detected light decreases gradually as formation of the hologram proceeds, and since it is not influenced by a light beam the intensity of which increases as formation of a hologram proceeds, the forming condition of the hologram can be detected with a high degree of accuracy.

It is to be noted that, in the example shown in FIG. 5, the diffracted light of the monitor light beam 70 by the hologram may be detected alternatively. In this case, the intensity of the detected light increases gradually as formation of the hologram proceeds.

Next, optimization of a fixing condition will be described with reference to FIGS. 6 and 7.

First, FIG. 6 shows an example wherein diffracted light and non-diffracted light of a fixing light beam by a hologram are detected. Referring to FIG. 6, same reference numerals to those of FIGS. 1 and 2 denote corresponding elements. A fixing light beam 50 is totally internally reflected at the boundary of the recording plate 17 from the air and is partially diffracted by a hologram to make diffracted light 50a, which is then detected by a detector 62. Meanwhile, non-diffracted light 50b which has not been diffracted by the hologram passes through the recording plate 17 and is then projected from the prism 16 and detected by another detector 63.

Outputs of the detectors 62 and 63 are applied to the fixing controlling apparatus 101, at which a difference between the outputs of the detectors 62 and 63 is detected. As described hereinabove, as fixing of the hologram proceeds, the intensity of the diffracted light 50a of the fixing light beam 50 increases while the intensity of the non-diffracted light 50b decreases, and consequently, the fixing condition of the hologram can be detected by detecting a difference in intensity between the two light beams. The apparatus 101 controls, based on the outputs from the detectors 62 and 63, opening or closing function of the shutter in the illuminating optical system for irradiation of the fixing light beam and also controls the intensity of the fixing light beam.

Figure 7:
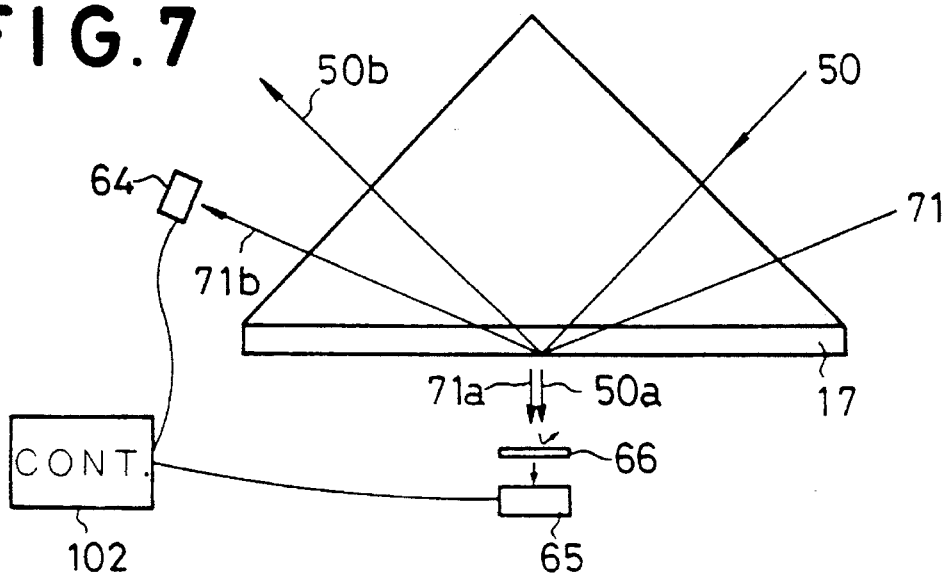
FIG. 7 shows another example of configuration of the exposure amount detecting and controlling system upon fixing operation of the exposure apparatus according to the first embodiment.

Referring now to FIG. 7, there is shown an example wherein a fixing condition of a hologram is detected by means of a monitor light beam 71 having a different wavelength from that of a fixing light beam. The monitor light beam 71 enters the prism 16 obliquely and is partially diffracted in the recording plate 17 to make diffracted light 71a. In this instance, while also diffracted light 50a of the fixing light beam 50 advances in the same direction as that of the diffracted light 71a of the monitor light beam 71, since the two beams have different wavelengths, only the diffracted light 71a of the monitor light 71 can be selectively introduced into the detector 65 by a wavelength selecting filter 66 interposed in the light path.

Non-diffracted light 50b of the fixing light beam and non-diffracted light 71b of the monitor light beam which have not been diffracted by the recording plate 17 are transmitted through the recording plate 17 and exit from the prism 16. In this instance, since the exit directions of the two light beams are different from each other, only the non-diffracted light 71b of the monitor light beam can be selectively detected by adjusting the position of the detector 64.

Similarly to the case shown in FIG. 6, also in the case of FIG. 7, as fixing of the hologram proceeds, the intensity of the diffracted light 71a of the monitor light 71 increases while the intensity of the non-diffracted light 71b decreases. Accordingly, the fixing condition of the hologram can be detected by detecting a difference in intensity between the two light beams. Control means 102 controls opening or closing function of the shutter in the illuminating optical system for a fixing light beam, the intensity of the fixing optical beam, and so forth.

It is to be noted that, while, in the constructions as shown in FIGS. 6 and 7, both of the diffracted light 50a and 71a and the non-diffracted light 50b and 71b are detected, the invention is not limited thereto, and either one of the diffracted light and the non-diffracted light may also be detected for the same purpose.

Further, while, in the description above, the holography which involves a totally internally reflected light beam has been described, the present invention can be applied to holography based on a transmitted light beam. However, in the total reflection holography, as exposure for hologram recording proceeds and the variation of the refractive index of the recording plate increases, also the diffraction efficiency increases, but in the transmission holography, when the variation of the refractive index of the hologram increases, the diffraction efficiency temporarily increases but thereafter exhibits a dropping tendency. Accordingly, attention must be paid to this point in control of the exposure amount upon recording of a hologram in the transmission holography.

Since a forming condition and a fixing condition of a hologram can be discriminated on the real time basis upon recording and reconstruction of the hologram, the time required for setting of an exposure condition or a fixing condition can be reduced remarkably. Further, since an exposure condition or a fixing condition is determined using an actual mask pattern to be recorded, an optimum condition can be obtained with certainty.

Figure 8A:
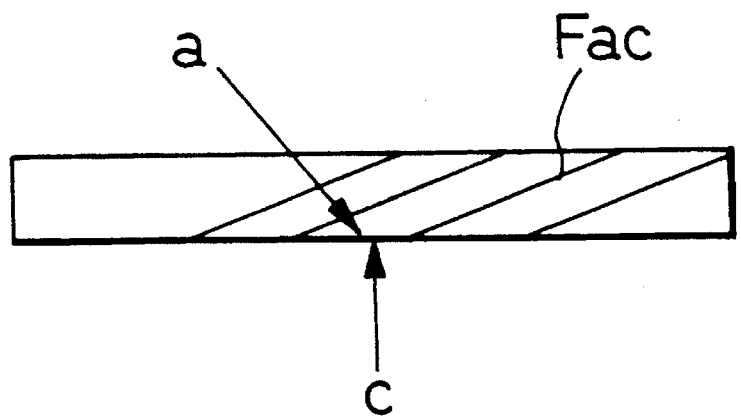
FIGS. 8a, 8b and 8c diagrammatically show three principal types of interference fringes formed in a hologram recording medium under the presence of totally internally reflected light.
Figure 8B:
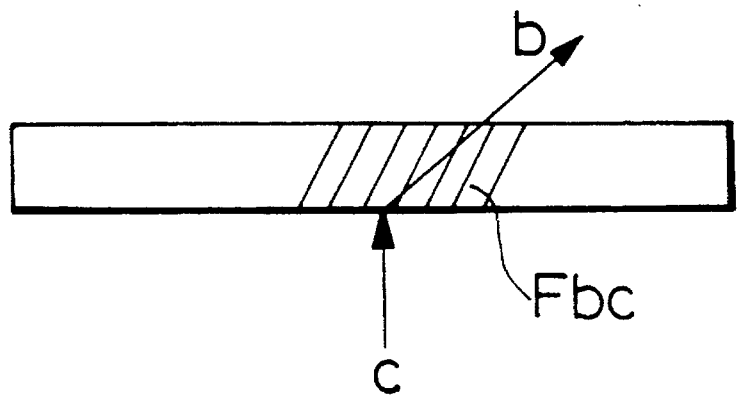
Figure 8C:
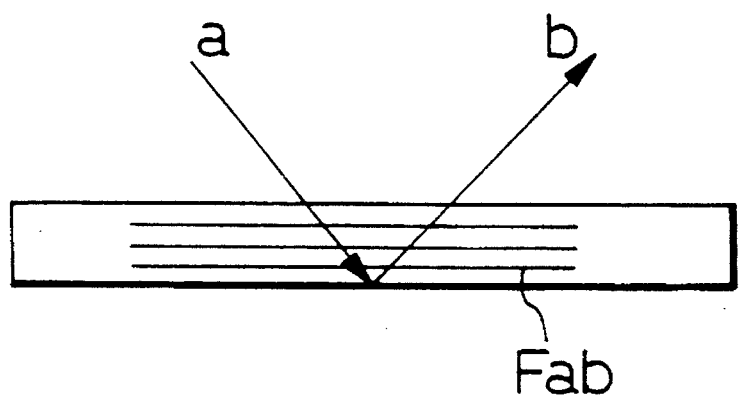

Analyzing interference fringes formed in a recording medium layer in hologram recording of the total internal reflection holography system, they include, when dividing them roughly, three types of interference fringes including of such fringes Fac formed by interference between an incident reference beam a and a subject beam c as shown in FIG. 8a, such fringes Fbc formed by interference between a totally reflected reference beam b and a subject beam c as shown in FIG. 8b and such fringes Fab formed by interference between an incident reference beam a and a totally reflected reference beam b as shown in FIG. 8c. While the interference fringes Fac and the interference fringes Fbc are shown as interference fringes formed by zero-order diffracted light in FIGS. 8a and 8b, they are actually formed from interference fringes by diffracted light of some other orders overlapping with interference fringes by zero-order diffracted light in accordance with a pattern of an object (mask), and both of the interference fringes Fac and Fbc contribute to reconstruction of a hologram image. Meanwhile, the interference fringes Fab are interference fringes of standing waves formed in parallel to the incident plane in the recording medium layer, and they are an unnecessary component which does not contribute to reconstruction of a hologram image. Therefore, if the existence of the interference fringes Fab of standing waves is eliminated, then since the amount of loss of light reflected at the interference fringes Fab of standing waves upon reconstruction of the hologram decreases, the amount of light which substantially contributes to reconstruction of an image increases and the efficiency is enhanced.

Figure 9:
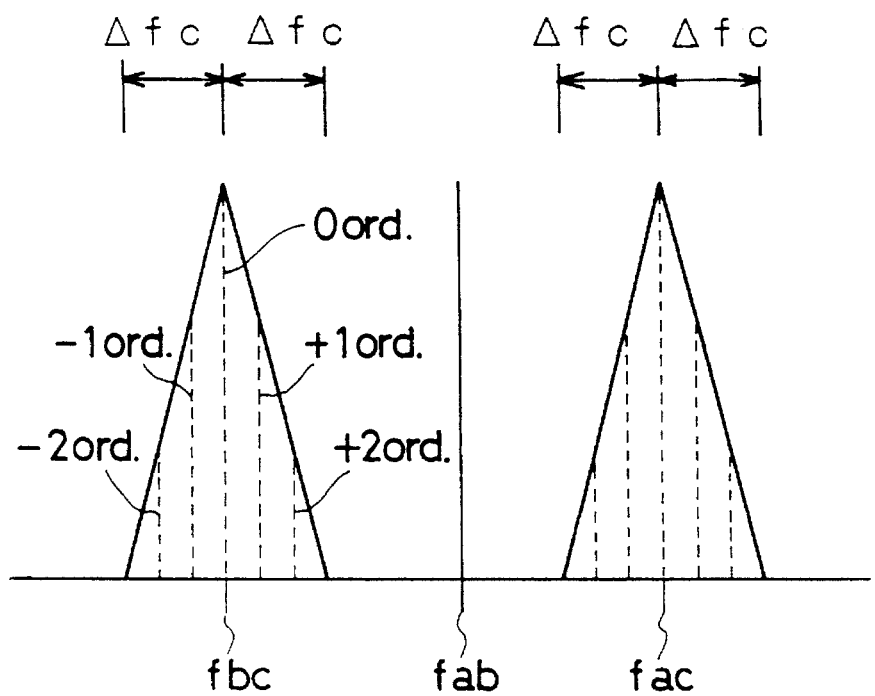
FIG. 9 diagrammatically shows distribution characteristics of spatial frequencies of the three types of interference fringes.

An outline of distribution of spatial frequencies of the three kinds of interference fringes Fac, Fbc and Fab as described hereinabove with reference to FIGS. 8a, 8b and 8c is illustrated in FIG. 9. Each of the interference fringes Fac and Fbc has a band extent corresponding to a spatial frequency band of a subject beam, and the value of its bandwidth Δ fc corresponds to a maximum diffraction angle ±α of the subject beam. When the object or the pattern of the mask is a regular pattern, the distribution then is such a discrete distribution corresponding to the number of orders of diffraction as indicated by broken lines in FIG. 9. It is a matter of course that the interference fringes Fab formed by mutual interference between the incident reference beam a and the totally reflected reference beam b do not have a band extent anyway.

Now, referring to FIG. 1, when the incident angle of the incident reference beam to the recording plate 17 is substantially equal to 45 degrees and perpendicular to the totally internally reflected reference beam, since P-polarized light beams of them cross perpendicularly to each other in the recording medium layer, no substantial interference between them occurs, and accordingly, production of such interference fringes Fab of standing waves as will make a cause of trouble upon later reconstructing operation is prevented.

That is, in such illuminating condition of the reference beam, only either such interference fringes Fac between the incident reference beam a and the subject beam c as shown in FIG. 8a or such interference fringes Fbc between the totally reflected reference beam b and the subject beam c as shown in FIG. 8b are formed in the recording medium layer. Therefore, since recording elements (for example, particles of such monomer or silver halide as mentioned hereinabove) in the recording medium layer are concentrated only upon fringes necessary for reconstruction of an image, interference fringes can be formed efficiently and a hologram of a high signal-to-noise ratio can be obtained.

It is to be noted that, while standing wave interference fringes Fab are not formed, since uniform background light may be present in the recording medium layer, there is the possibility that the contrast of the interference fringes Fac or Fbc may decrease, and accordingly, it is desirable to suitably select the intensity of the reference beam or the subject beam or the threshold level for the sensitivity of the recording medium layer.

Figure 10:
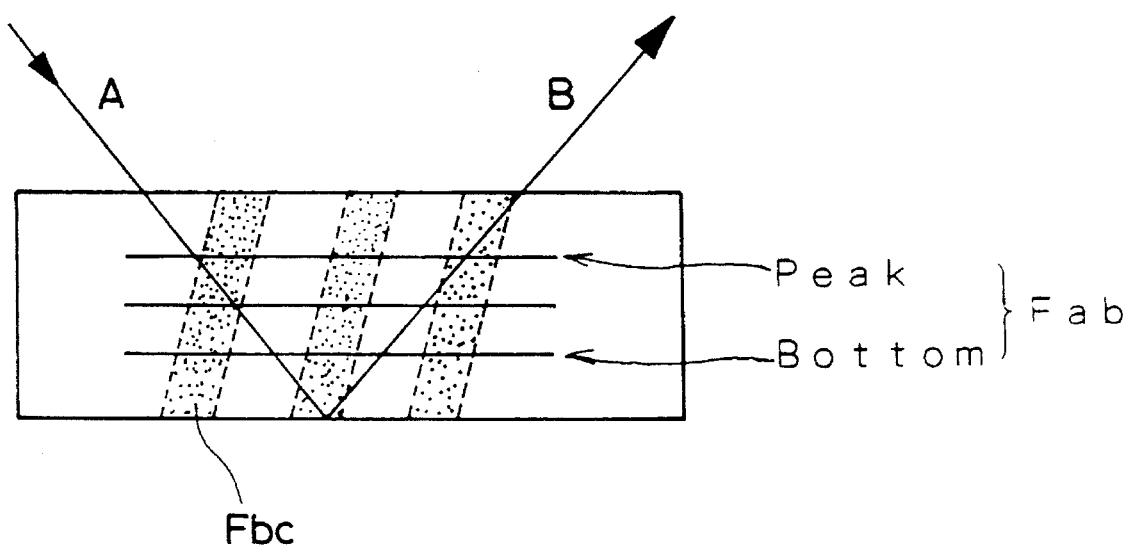
FIG. 10 diagrammatically illustrates a manner of fixing of a hologram to a recording medium layer.

Further, if only the second illuminating optical system 10 is selectively put into an operative condition by the control apparatus 100 and 110 so that the reference beam of P-polarized light may be illuminated as a fixing light beam also upon fixing operation, then since this prevents unnecessary standing waves Fab from being formed in the recording medium layer, fixing of at least one of the interference fringes Fac and Fbc can be performed completely. More particularly, if interference fringes $F_{AB}$ are formed in the recording medium layer by mutual interference between a fixing incident light beam A irradiated along the same optical path as the reference beam a and a totally internally reflected light beam B of the incident light beam A as shown in FIG. 10, then at peaks of standing waves, since light is intensified, for example, polymerization of monomer proceeds, but at bottoms of standing waves, since light is weakened, polymerization of monomer becomes insufficient. Thus, if a fixing light beam is introduced as a light beam of P-polarized light from the second illuminating optical system 10 at the incident angle of almost 45 degrees into the recording plate 17, then the incident light beam and a totally internally reflected light beam of the incident light beam do not interfere with each other in the recording plate, and consequently, fixing of at least one (Fbc in FIG. 10) of the object interference fringes Fac and Fbc will be achieved completely.

When a fixing light beam other than a reference light source of P-polarized light must be used, it is effective to modulate the fixing light beam in phase so as to cause standing waves in the recording medium layer to oscillate. Further, illumination for uniform fixing processing can be realized also, for example, by illuminating as fixing light beams two mutually perpendicularly polarized light beams from both of the first illuminating optical system 20 for a subject beam and the second illuminating optical system 10 for a reference beam. This can be realized by disposing a polarizing element 12 such as a half-wave plate for at least one of the first and second illuminating optical systems, and no special fixing illuminating optical system is required.

Figure 11:
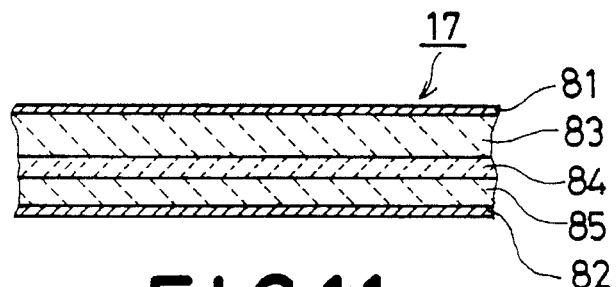
FIG. 11 shows an example of layer structure of a recording plate.

Next, the recording plate 17 will be described. FIG. 11 is an enlarged partial view showing a layer structure of the recording plate according to one embodiment. Referring to FIG. 11, the recording plate basically has a three-layer structure including a support plate 83 made of a transparent glass material and having a sufficient optical flatness, a protect plate 85 made of a transparent glass material and having a sufficient optical flatness similarly, and a recording medium layer 84 held in an enclosed condition between the support plate 83 and the protect plate 85. For handling when it is not mounted on the exposure apparatus, the outer face of each of the support plate 83 and the protect plate 85 is coated with a cover film 81 or 82 for preventing formation of a scar or sticking of dust or the like. The cover films 81 and 82 are peeled off and removed immediately before the recording plate 17 is mounted onto the exposure apparatus.

Figure 12:
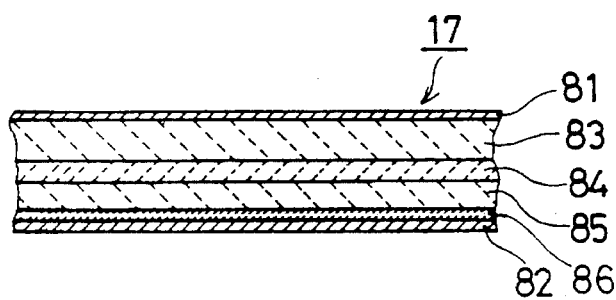
FIG. 12 shows another example of layer structure of the recording plate.

In a modification shown in FIG. 12, an antireflection film 86 having a sufficiently high flatness is provided on the surface of the protect layer 85 so as to substantially form a four-layer structure. The anti-reflection film 86 covers over the incident plane of the subject beam c (28).

It is to be noted that, in FIGS. 11 and 12, the thickness of each of the layers of the recording plates is illustrated only conceptively and does not reflect the ratio in actual thickness.

Figure 13:
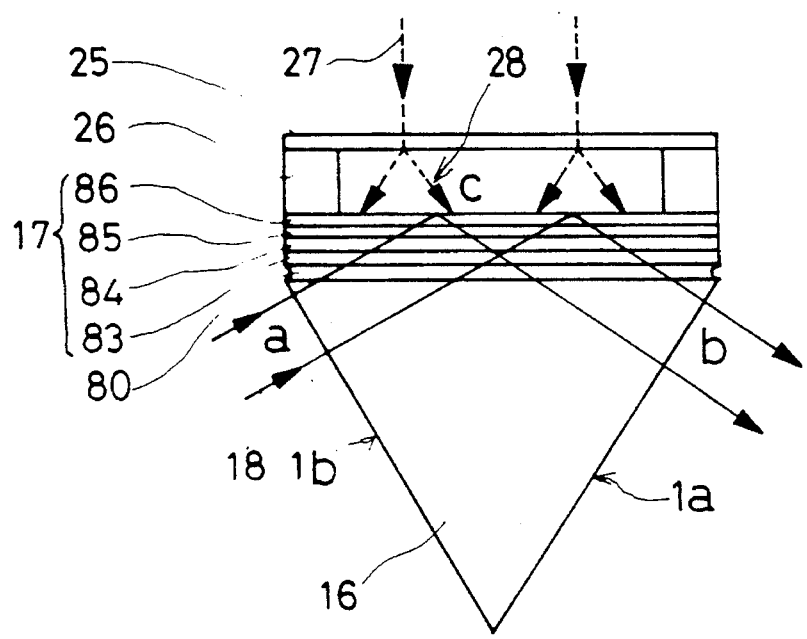
FIG. 13 shows an example of arrangement of essential part upon recording operation using a layered recording plate with a protect plate.

FIG. 13 is a diagrammatic view of essential part of the recording plate 17 having the structure shown in FIG. 12 when the recording plate 17 is placed on the prism 16 to perform a hologram recording operation, and in FIG. 13, the same reference numerals to those of FIG. 1 denote corresponding elements. The surface of the support plate 83 for the recording plate 17 is supported in a horizontal plane upon an upper face of the prism 16 with a layer 80 of index matching liquid interposed therebetween, and the prism 16, the index matching liquid layer 80 and the layers of the recording plate 17 are made of materials having a substantially equal refractive index. The mask 25 is disposed in parallel to the recording plate 17 with a predetermined gap left therebetween by the spacer 26.

The mask 25 is illuminated by a coherent light beam 27, and a subject beam c (28) transmitted through and exitet from the mask 25 is transmitted through the protect plate 85 covered with the antireflection film 86 and enters the recording medium layer 84. Meanwhile, a reference beam a (18) is irradiated upon the prism 16. Thus, the reference beam a transmitted through the prism 16 and entering the recording medium layer 84 by way of the support plate 83 is totally internally reflected at the boundary of the recording plate 17 from the air, that is, in this instance, the boundary of the antireflection film 86 from the air. The totally reflected light beam b is transmitted through the layers of the recording plate 17 again and exits from the inside of the prism 16 to the outside. Interference fringes formed by interference of the incident reference beam a and the totally reflected reference beam b with the subject beam c in the recording medium layer 84 then are recorded as hologram information corresponding to the mask pattern in the recording medium layer 84. The hologram is fixed by irradiating ultraviolet rays or the like upon the recording plate 17 as described hereinabove.

Figure 14:
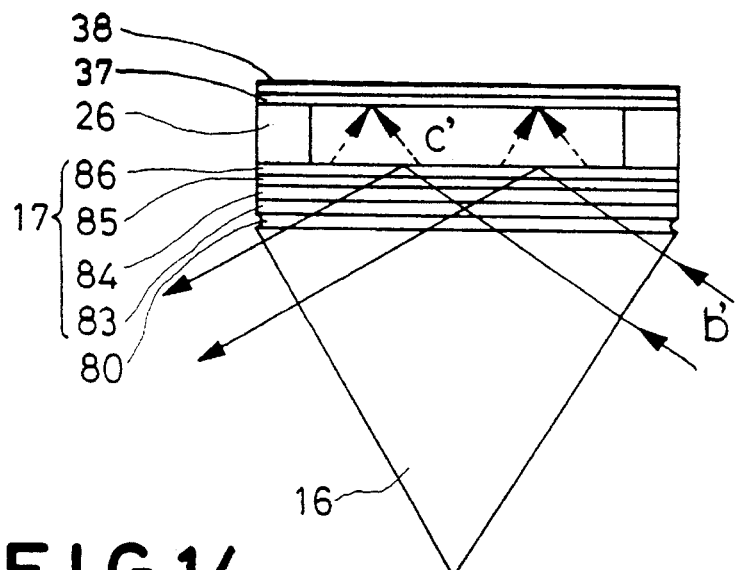
FIG. 14 shows an example of arrangement of essential part upon reconstructing operation using the layered recording plate with a protect plate.

In FIG. 14 corresponding to FIG. 2, reproduction of the pattern onto a photo-sensitive surface of a wafer by a reconstructing operation of the hologram is performed by disposing the wafer 38 having resist layer 37 coated to the surface thereof in place of the mask 25 on the spacer 26. When a conjugate light beam b' with the light beam b is irradiated upon the prism 16 but in the direction opposite to the direction from which the totally reflected light beam b was exited as described above, the light beam b' is transmitted through the prism 16 and reaches the recording medium layer 84 by way of the support plate 83. Further, the light beam b' passes through the protect plate 85 and is totally internally reflected at the boundary of the antireflection film 86 from the air similarly, and the totally reflected light beam is transmitted through the layers of the recording plate 17 again and exits from the inside of the prism 16 to the outside. When the conjugate light beam b' passes through the recording medium layer 84, part of the beam b' is diffracted by a hologram formed in the recording layer 84. The thus diffracted light passes through the protect plate 85 and the antireflection film 84 to make conjugate light c' with the subject beam c used upon the preceding recording operation. A light beam component (non-diffracted light) which has not been diffracted by the hologram in the recording medium layer 84 is totally internally reflected at the boundary of the antireflection film 86 from the air so that it is returned to the recording medium layer 84. The thus returned non-diffracted light is diffracted by the hologram in the recording medium layer 84 and passes through the protect plate 85 and the antireflection film 86 again to make conjugate light c' with the subject beam c.

The conjugate light c' formed in this manner forms a reconstruction image of the hologram at the position at which the mask 25 has been disposed. Accordingly, if the resist layer 37 of the wafer 38 is positioned at the position of the mask 25 then, the reconstructed image is reproduced onto the resist.

It is to be noted that, in the recording plate as shown in FIG. 11 which does not include the antireflection film 86, upon recording operation, the reference beam a is totally internally reflected at the boundary of the protect plate 85 from the air so that a totally reflected light beam b is formed. Interference fringes of such incidence reference beam a and totally reflected reference beam b with the subject beam c are recorded as holograms in the recording medium layer 84. This similarly applies to a reconstructing operation.

Where the recording plate 17 having the protect plate 85 is used in this manner, since the recording medium layer 84 is protected by the protect plate 85 which is superior in flatness, a reference beam upon recording operation is totally internally reflected at the boundary of the protect plate 85 from the air or at the boundary of the antireflection film 86 from the air. Accordingly, since the boundaries are superior in flatness, also the flatness of the wave front of the totally internally reflected light beam is maintained good, and no strain is produced in interference fringes formed by interference between the totally internally reflected light beam and the subject beam. Consequently, a hologram with a very high degree of accuracy can be formed. Further, also upon reproduction of a pattern onto a wafer by a reconstructing operation, the occurrence of the confusion or disorder of the wave front is substantially prevented for the totally internally reflected light beam of the conjugate light beam entering for reconstruction. Consequently, a reconstructed image from the hologram can be obtained with a high fidelity and also reproduction of a very fine pattern is permitted.

Where the antireflection film 86 is not provided on the surface of the protect plate 85, the subject beam c upon recording operation is reflected at the boundary of the recording medium layer 84 from the protect plate 84 and then re-reflected at the surface of the mask 25, thereby causing multiple reflection. The antireflection film 86 not only contributes to prevention of occurrence of such multiple reflection but also contributes to prevention of multiple reflection of reconstructed light c' between the surface of the mask and the boundary upon reconstructing operation. Consequently, no unnecessary exposure light is admitted to the resist 37.

While the arrangements of FIGS. 11 and 12 are shown having the construction wherein the recording medium layer 84 is held between the support plate 83 and the protect plate 85, when the protect plate 85 has a function of supporting the recording medium layer 84 thereon, the support plate 83 may have a thickness sufficient to maintain a predetermined flatness. Further, it is also possible for the prism 16 to have the function of the support plate 83. In this case, the recording medium layer 84 in FIG. 13 or 14 is closely contacted directly with the prism 16 by the index matching liquid layer 80.

Further, while, in FIGS. 13 and 14, the optical axes of incident light of the reference beam a upon recording operation and the reconstructing beam b' upon reconstructing operation cross perpendicularly with the face of the prism, the optical path arrangement is required to be constructed only such that an incident light beam is totally internally reflected in the recording plate, and the light beams mentioned above may be refracted at the incident plane of the prism.

Further, in the recording plate 17 of any of such layer structures as shown in FIGS. 11 and 12, if the support plate 83 or the protect plate 85 is made of an electric conductor material or has another transparent electrical conducting film placed thereon, then electrical energization of it will result in generation of heat, and accordingly, the fixing process described hereinabove can be performed in an on-machine condition making use of the thus generated heat. For example, if such an additional conducting film is provided between the protect plate 85 and the antireflection film 86 of the construction of FIG. 13, it is effective to employ such a construction that the reference beam a or the reconstructing beam b' and a totally internally reflected light beam thereof pass through the conducting film in the recording plate so that total internal reflection of the incident light beams may take place at the boundary of the antireflection film from the air.

It is to be noted that, if a face of any of the protect plate and the antireflection film which is exposed to the surface is formed as a hydrophobic surface and microwaves are radiated to the hydrophobic surface after water is sprayed to the hydrophobic surface, then the recording medium layer can be heated for fixing operation.

Now, it has been described hereinabove that, in hologram recording of the total internal reflection holography system, interference fringes formed in the recording medium layer of the recording plate are roughly divided into such three types as shown in FIGS. 8a, 8b and 8c and such interference fringes Fac, Fbc and Fab exhibit such spatial frequency distributions as shown in FIG. 9. The interference fringes Fac and Fab are each formed by interference between light beams which advance in the opposite directions to each other, and form a so-called reflection hologram. Meanwhile, the interference fringes Fbc are formed by interference between light beams which advance in the same direction as each other, and form a so-called transmission hologram. The pitch of fringes of a reflection hologram is finer than that of a transmission hologram and also higher in spatial frequency. In short, where the spatial frequencies of fringes by zero-order diffracted light of the interference fringes Fac and the interference fringes Fbc are represented by fac and fbc, respectively, then fbc<fac Further, since the pitch of the interference fringes Fbc is varied by the incident angle of the reference beam, the relationship between the spatial frequency fab of the standing wave interference fringes Fab and the spatial frequencies fac and fbc has such various cases as given below:

fbc<fab, fbc=fab, fbc>fab

Meanwhile, also the photo-sensitive characteristic of the recording medium layer of the recording plate 17, has a spatial frequency characteristic, which is a characteristic generally functioning as a band-pass filter. In particular, if the spatial frequency which provides a marginal sensitivity on the low frequency side is represented by $f_L$ and the spatial frequency which provides a marginal sensitivity on the high frequency side by $f_H$, then the recording medium layer has a photo-sensitivity to a spatial frequency f of a band given by $f_L < f < f_H$ and only interference fringes within the spatial frequency band will be recorded. The values of the marginal sensitivity spatial frequencies $f_L$ and $f_H$ can be selected to desired values based on the composition of a material forming the recording medium layer.

Figure 15:
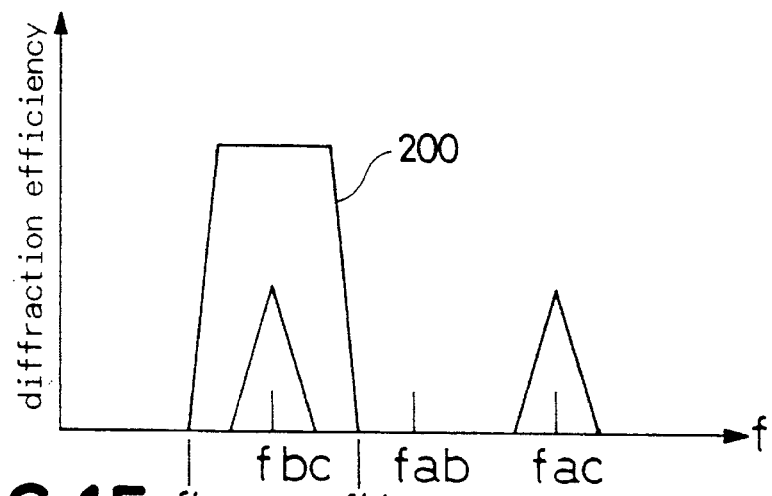
FIG. 15 shows an example of a spatial frequency recording characteristic of a recording medium layer.

For example, referring to FIG. 15, when the spatial frequency recording characteristic of a certain hologram recording medium material is given, as denoted by reference numeral 200, by $f_L<fbc<f_H$, and $f_H<fac$, fab only interference fringes Fbc are recorded in a recording medium layer made of the material.

Figure 16:
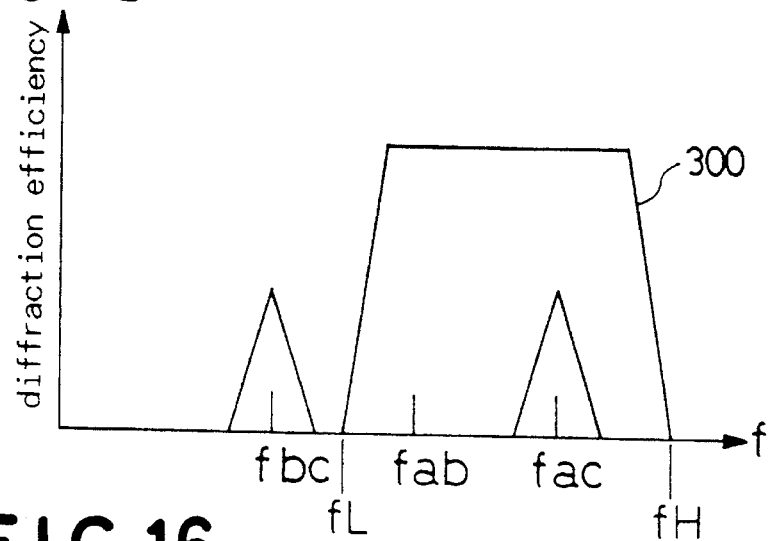
FIG. 16 shows another example of the spatial frequency recording characteristic of the recording medium layer.

On the other hand, referring to FIG. 16, when the spatial frequency recording characteristic of another certain hologram recording medium material is given, as denoted by reference numeral 300, by $f_L<fac<f_H$, $f_L<fab<f_H$, and fbc<$f_L$ interference fringes Fac and standing wave interference fringes Fab are recorded in a recording medium layer made of the material, but interference fringes Fbc are not recorded.

In a volume hologram formed in holography of the total internal reflection type, a reconstruction image is formed by Bragg diffraction by the hologram, and in Bragg diffraction, the finer the pitch of fringes, the higher the diffraction efficiency. Even when a recording medium layer is formed from a material having such a spatial frequency recording characteristic wherein only interference fringes Fbc from which a transmission hologram is formed are recorded as shown in FIG. 15, a lithography step having a high efficiency can be performed for practical use.

If the wavelength used is represented by $\lambda$ and the refractive index of the recording medium by n and two zero-order diffracted light beams which interfere with each other are both plane waves and cross with each other at the angle of θ, then the pitch R of interference fringes formed in a recording medium layer is given by $p=\lambda/[2n\cdot\sin(\theta/2)]$ In holography of the total internal reflection type, when the incident angle of a reference beam is 45 degrees and the incident angle of a subject beam is 0 degree, (1) the angle θ ab between the incident reference beam a and the totally reflected beam b: θ ab=90 degrees (2) the angle θ bc between the totally reflected beam b and the subject beam c: θ bc=45 degrees (3) the angle θ ac between the incident reference beam a and the subject beam c: θ ac=135 degrees Further, where the refraction index n of the recording medium layer is n=1.5, the pitches $p_{ab}$, $p_{bc}$ and $p_{ac}$ of interference fringes (Fab, Fbc and Fac) in the case of He—Ne laser (λ=633 nm) and UV Ar laser (λ=364 nm) and spatial frequencies (inverse numbers to frequencies) fab, fbc and fac of them are such as described below:

(a) In the case of He—Ne laser (λ=633 nm):
  (1) Fab (θab=90 deg.): $p_{ab}$=298.8 nm, fab=3,351/mm
  (2) Fbc (θbc=45 deg.): $p_{bc}$=551.4 nm, fbc=1,814/mm
  (3) Fac (θac=135 deg.): $p_{ac}$=228.4 nm, fac=4,379/mm (b) In the case of UV Ar laser (λ=364 nm):
  (1) Fab (θab=90 deg.): $p_{ab}$=171.6 nm, fab=5,828/mm
  (2) Fbc (θbc=45 deg.): $p_{bc}$=317.1 nm, fbc=3,154/mm
  (3) Fab (θac=135 deg.): $p_{ac}$=131.3 nm, fac=7,614/mm For the He—Ne laser (λ=633 nm), a photo-sensitive material having the maximum recordable spatial frequency of 2,000/mm is available under the trade name of 10E75 from Agfa, Germany, and if the recording medium layer of the recording plate is constructed by this material, it is possible to obtain the recording plate which can record interference fringes Fbc having a comparatively low spatial frequency but does not record interference fringes Fac and Fab having a spatial frequency higher than the spatial frequency as shown in FIG. 15.

Further, another photo-sensitive material marketed under the trade name of SP695T from Ilford Co., United States, has a resolution of 7,000/mm and employs UV Ar laser ($\lambda=364$ nm) as a light source so that interference fringes Fac of a comparatively high spatial frequency can be excluded outside the recording sensitivity band while interference fringes Fab of standing waves and interference fringes Fbc of a comparatively low spatial frequency can be included in the recording sensitivity band. Interference fringes Fab of standing waves can be prevented from being recorded by such a contrivance as to make use of P-polarized light as a reference beam as described hereinabove, and as a result, only interference fringes Fbc of a comparatively low spatial frequency can be recorded.

It is to be noted that, depending upon a spatial frequency recording characteristic of the recording medium layer, an objective one of the interference fringes Fac and Fbc may possibly be recorded simultaneously with the other interference fringes than the objective interference fringes, but if the diffraction efficiency of interference fringes other than the objective interference fringes is sufficiently low, such recording of the same does not occur any matter on general occasion.

Further, with a recording medium layer having a limited spatial frequency recording characteristic which does not have a recording sensitivity to interference fringes of standing waves in this manner, even if the interference fringes Fab of standing waves are formed in the recording medium layer, there is no influence of the interference fringes Fab as described above, and accordingly, also in a fixing process, similar advantages to those described hereinabove with reference to FIG. 10 can be obtained.

Figure 17:
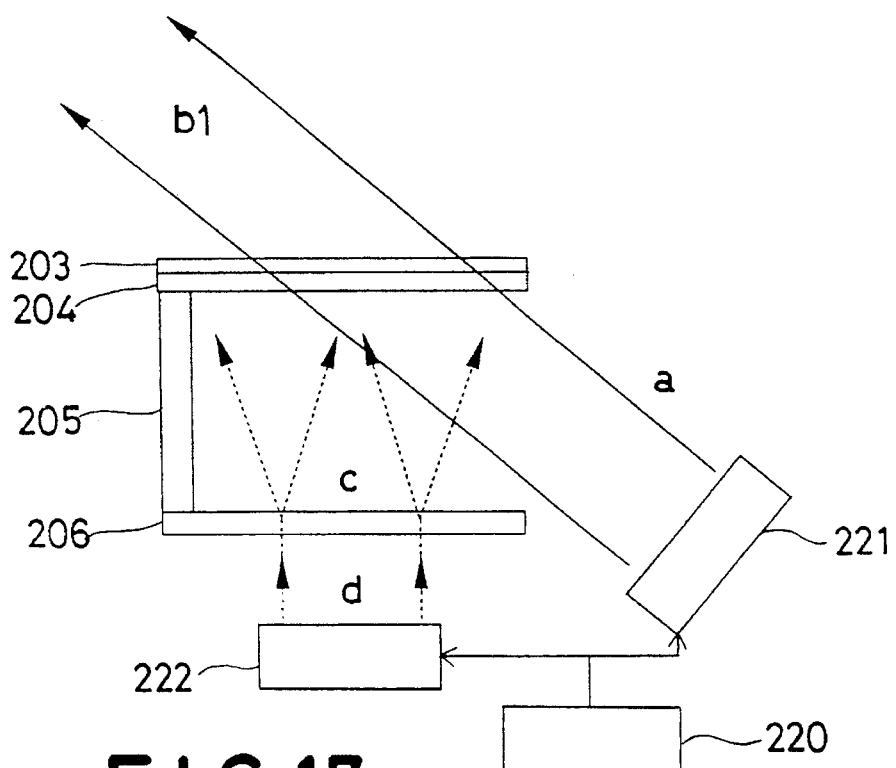
FIG. 17 shows an example of configuration of a basic optical system necessary upon recording operation of an exposure apparatus according to a second embodiment of the present invention.
Figure 18:
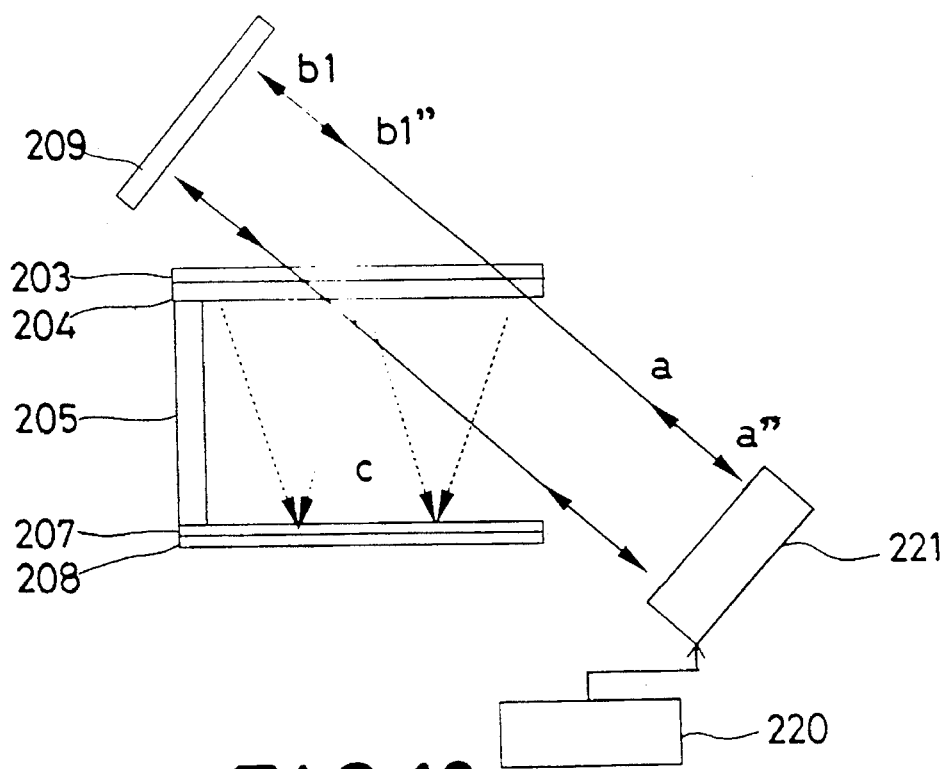
FIG. 18 shows an example of configuration of a basic optical system necessary upon reconstructing operation of the exposure apparatus according to the second embodiment.

Next, a second embodiment of the present invention will be described with reference to the accompanying drawings. FIGS. 17 and 18 are diagrammatic views showing a construction of an exposure apparatus according to the second embodiment of the present invention. In particular, elements necessary for operation of recording a hologram are shown in FIG. 17 while elements necessary for operation of reconstructing a hologram are shown separately in FIG. 18.

The present embodiment provides an exposure apparatus according to transmission holography. Referring first to FIG. 17, upon recording operation, coherent light from an Ar laser light source 220 is split by a lens system and a beam splitter not shown into two expanded parallel light beams of a predetermined sectional area. One of the split light beams is introduced as an illuminating light beam d upwardly from below into a mask 206 by a first subject light illuminating optical system 222, and a transmitted light beam diffracted by a pattern of the mask 206 is introduced as a subject beam c upwardly into a photo-polymeric recording medium layer 204. Meanwhile, the other light beam is introduced as a reference beam a obliquely upwardly from below into the recording medium layer 204 by a second illuminating optical system 221.

The reference beam a passes through the recording medium layer 204 and a supporting substrate 203 for the layer 204 and exits as a light beam b1 from the recording medium layer 204. Thereupon, the reference beam a and the subject beam c interfere with each other in the recording medium layer 204, and interference fringes formed by the interference are recorded as a hologram in the recording medium layer 204. The interference fringes are fixed by illuminating a fixing light beam such as ultraviolet rays uniformly upon the recording medium layer 204. Thus, information of the mask pattern is recorded as a hologram in the recording medium layer 204 in this manner.

Subsequently, reproduction of the mask pattern thus recorded and kept as a hologram onto a wafer is performed by making use of the reference beam a for recording operation as it is as a source light beam for reconstruction while a phase conjugate mirror 209 is disposed on a plane substantially perpendicular to the axial direction of the light beam b1 upon recording operation as shown in FIG. 18. The phase conjugate mirror 209 has a nature of returning a reflected light beam conjugate in phase in the direction of the optical axis which is same as the incident direction. Accordingly, the arrangement plane of the phase conjugate mirror 209 need not be a plane completely perpendicular to the axial direction of the light beam b1 and may be inclined with somewhat of angle. Consequently, alignment operation for the reconstructing light source in the incident direction upon reconstructing operation with respect to that upon recording operation of the hologram need not be established.

Figure 21:
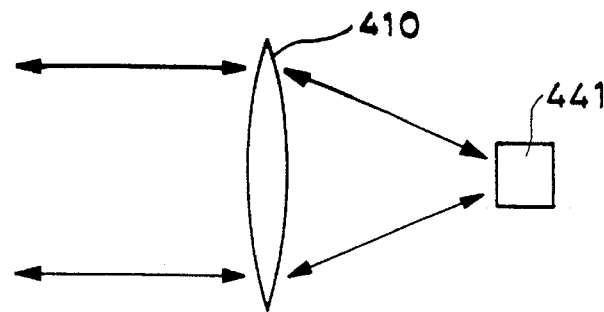
FIG. 21 shows an example of construction of a phase-conjugate mirror.

An example of such phase conjugate mirror is shown in FIG. 21. As shown in FIG. 21, a light beam entering and converged by a lens 410 is reflected by phase conjugate crystal 411 such as BaTiO3 and exits therefrom in the opposite direction along the same optical path as that of the incident light. It is to be noted that the phase conjugate mirror 209 of the present example may be, for example, a phase conjugate mirror disclosed in Optics Letters, Vol. 7, No. 10, 1982, pp.486–488.

A reflected light beam b1" by the phase conjugate mirror 209 is conjugate in phase with the light beam b1 upon recording operation, and when it is transmitted through the supporting substrate 203 and the recording medium layer 204, part of the light beam is diffracted by interference fringes of a hologram recorded in the recording medium layer 204. As a result of such diffraction, conjugate light c" with the subject beam c used upon recording operation is produced. The conjugate light c" reconstructs an image of the hologram at the position at which the mask was upon recording operation. Accordingly, if a resist layer 207 of a wafer 208 is disposed, in prior to reproducing operation, at the position at which the mask has been, then the mask pattern is reproduced onto the resist layer 207 of the wafer 208 by the reproduction image. It is to be noted that non-diffracted light beam a" which has not been diffracted by the hologram is conjugate with the reference beam a and is returned with fidelity to the illuminating optical system 221.

Figure 19:
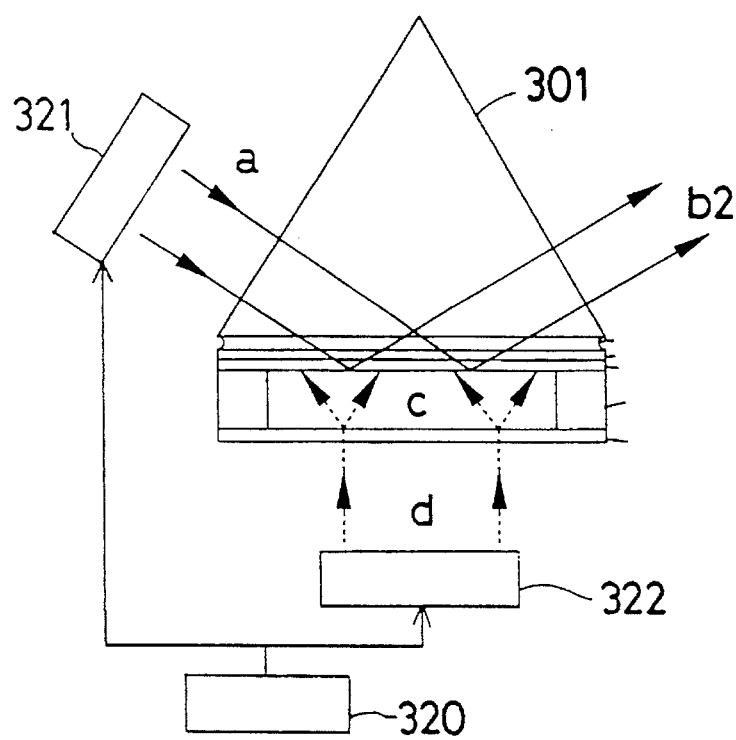
FIG. 19 shows an example of configuration of an optical system necessary upon recording operation of an exposure apparatus according to a third embodiment of the present invention.
Figure 20:
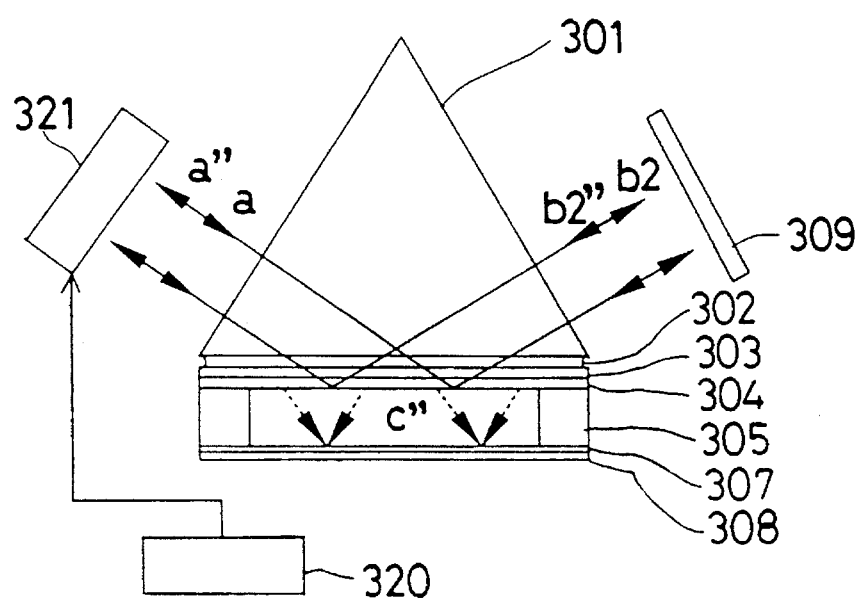
FIG. 20 shows an example of configuration of an optical system necessary upon reconstructing operation of the exposure apparatus according to the third embodiment.

FIGS. 19 and 20 show an exposure apparatus according to a third embodiment of the present invention. The exposure apparatus is based on holography of the total internal reflection type. Also in this instance, elements necessary for operation of recording a hologram are shown in FIG. 19 while elements necessary for operation of reconstructing a hologram are shown separately in FIG. 20, similarly as described above.

Referring first to FIG. 19, coherent light from an Ar laser light source 320 is split by a lens system and a beam splitter not shown into two expanded parallel light beams of a predetermined sectional area. One of the split light beams is introduced as an illuminating light beam d upwardly from below in FIG. 19 into a mask 306 by a first subject light illuminating optical system 322, and a transmitted light beam diffracted by a pattern of the mask 306 is introduced as a subject beam c upwardly into a photo-polymeric recording medium layer 304. Meanwhile, the other light beam is introduced as a reference beam a into a prism 301 by a second illuminating optical system 321. The reference light beam a passes through an index matching liquid layer 302, a supporting substrate 303 and a recording medium layer 304 and is totally internally reflected at a lowermost face of the layer structure, and the totally reflected light beam b2 exits from the opposite side of the prism 301 to that of the reference beam a.

The subject beam c interferes with the incident reference beam a and the totally reflected light beam b2 before and after the total internal reflection in the recording medium layer 304, and interference fringes by such interference are recorded as holograms in the recording medium layer 4. The holograms are fixed by illuminating a fixing light beam such as ultraviolet rays uniformly upon the recording medium layer 304. Thus, information of the mask pattern is recorded into and stored by the hologram in this manner.

Reproduction of the mask pattern onto a wafer is performed by making use of, similarly as in the second embodiment described hereinabove, the reference beam a for a recording operation as it is as a light source light beam of a reconstructing beam for a reconstructing operation while a phase conjugate mirror 309 is disposed on a plane substantially perpendicular to the advancing direction of the totally reflected light beam b2 upon recording operation of the hologram as shown in FIG. 20. In this instance, the arrangement plane of the phase conjugate mirror 309 need not be a plane completely perpendicular to the advancing direction of the light beam b2 and alignment operation for the reconstructing light source in the incident direction need not be established, similarly as in the second embodiment described above.

A reflected light beam b2" by the phase conjugate mirror 309 is conjugate in phase with the light beam b2 upon recording operation. After the conjugate light beam b2" enters the prism 301, it is transmitted through the index matching liquid layer 302, the supporting substrate 303 and the recording medium layer 304, and then it is totally internally reflected by the lowermost face of the recording medium layer 304. Thereupon, part of the conjugate light beam b" is diffracted by a hologram formed in the recording medium layer 304, and as a result of such diffraction, conjugate light c" with the subject beam c used upon recording operation is produced. Meanwhile, non-diffracted light beam a" which has not been diffracted by the recording medium layer 304 is totally reflected at the lowermost face of the recording medium layer 304, and part of it makes conjugate light a" with the reference beam a.

If a resist layer 307 of a wafer 308 is disposed, as shown in FIG. 20, at the position at which the mask was upon hologram recording operation, the conjugate light c" forms a reconstruction image on the resist layer 307 so that the mask pattern is reproduced onto the resist layer 307 of the wafer 308.

By using, as a reconstructing beam, phase conjugate light with a reference beam for a recording operation, the diffraction efficiency of a hologram and the resolution are enhanced and unnecessary exposure light components are reduced, and reproduction of a very fine pattern of a good quality free from irregularity is permitted.

Further, even if the alignment of a reconstructing beam in its incident direction is insufficient, superior reproduction of a hologram image can be performed, and since a conjugate reconstructing beam can be obtained by means of the phase conjugate mirror irrespective of the wave front of light, it becomes possible to use an illuminating system which is not complete in aberration correction.

Figure 22:
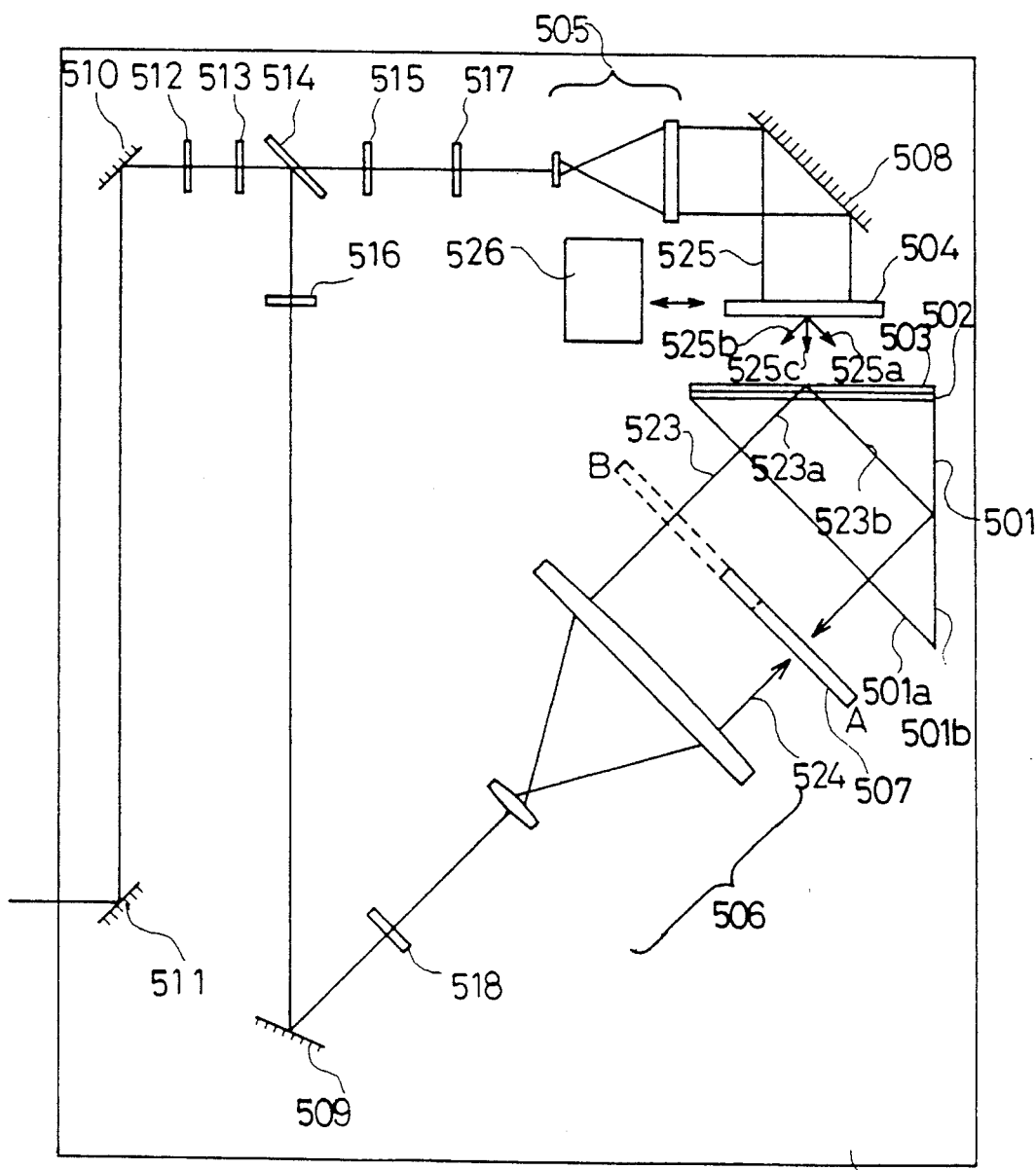
FIG. 22 shows an example of configuration of a basic optical system of an exposure apparatus according to a fourth embodiment of the present invention.
Figure 23:
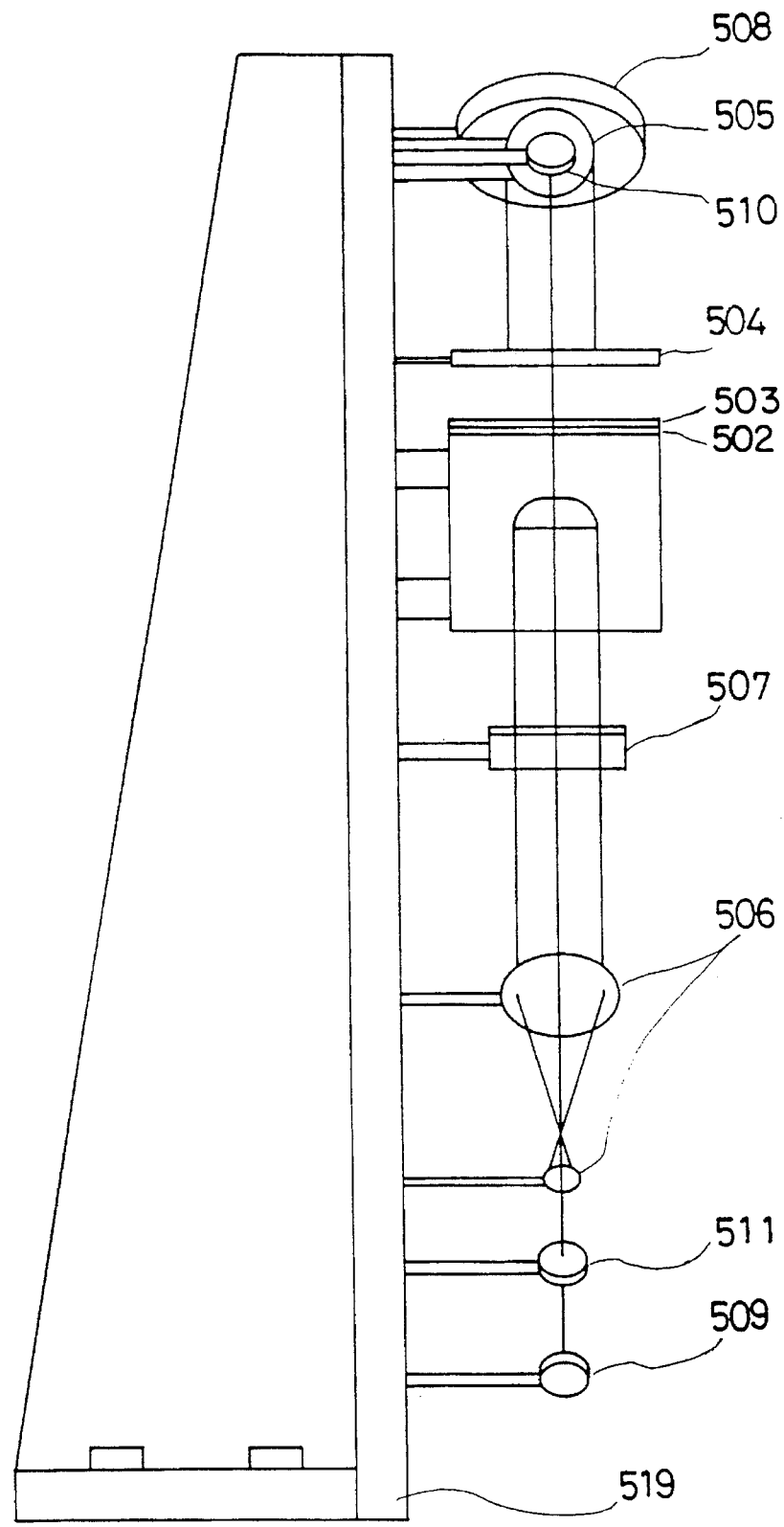
FIG. 23 shows, from a side, detailed construction of essential part of the exposure apparatus according to the fourth embodiment.

FIG. 22 is an optical path diagram showing a principal construction of an exposure apparatus according to a fourth embodiment of the present invention, and FIG. 23 is a side elevational view of a detailed construction of the apparatus of FIG. 22.

In the exposure apparatus of the present embodiment, several optical elements (which will be hereinafter described) are supported on an upwardly erected supporting wall 519 of a high rigidity as shown in FIG. 23, and components of several optical systems including a first illuminating optical system for a subject beam and a common illuminating optical system for a reference beam and a reconstructing beam are disposed in a vertical plane parallel to the surface of the supporting wall 519. The supporting wall 519 can be provided with a counterbalance weight-conforming to the weight of the optical systems to be supported thereon, and preferably, such counterbalance weight is installed particularly on a vibration-proof stage. Further, in the present embodiment, in order to prevent transmission to the optical systems of vibrations of a cooling mechanism of the water or air cooling type provided for a light source section (not shown), the light source section is disposed in an isolated condition from the supporting wall 519.

In the following, the construction upon hologram recording operation will be described. Referring to FIG. 22, a light beam of the wavelength of 364 nm emitted from an Ar laser light source (not shown) is entered in and reflected by a mirror 511 so that it is bounded up to a mirror 510. The light beam reflected by the mirror 510 enters a polarizing plate 512, by which the intensity and the polarizing direction thereof are modulated by the direction of the polarizing plate 512. The light beam is then converted into a light beam of a desired polarizing direction by a half-wave plate 513.

The light beam emerging from the half-wave plate 513 is split into S-polarized light (half-wave plate 516 side) and P-polarized light (half-wave plate 515 side) in a vertical plane by a polarizing beam splitter 514. The ratio in intensity between the S-polarized light and the P-polarized light can be adjusted readily by the direction of the half-wave plate 513.

Subsequently, the light beams split by the polarizing beam splitters 514 are converted, by the half-wave plates 515 and 516, into linearly polarized light polarized in directions which are not perpendicular to each other. The light beam split to the half-wave plate 515 side in FIG. 22 by the polarizing beam splitter 514 serves as a subject beam while the other light beam split to the half-wave plate 516 side serves as a reference beam or a reconstructing beam.

In the present embodiment, since a light beam from the light source is split by the polarizing member as described above, absorption substantially does not occur upon splitting, and the light beam from the light source can be utilized efficiently. Further, while it is important upon formation of a hologram to optimize the ratio in intensity between the reference beam and the subject beam, in the present embodiment, the ratio in intensity can be adjusted readily by the direction of the half-wave plate 513 as described above.

Further, in holography of the total internal reflection type, a reference beam 523a entering the hologram recording plate 503 and another reference beam 523b produced by total internal reflection of the incident reference beam 523a at the boundary of the recording plate 503 from the air above the recording plate 503 individually interfere with a subject beam, which has been transmitted through the mask 504 and entered the recording plate 503, thereby to form holograms. If the reference beams before and after the reflection, that is, the incident reference beam 523a and the totally reflected reference beam 523b, interfere with each other, then unnecessary ghosts will be produced in the holograms. In contrast, in the present embodiment, since the incident angle of the reference beam 523 is 45 degrees, if the reference beam 523 is irradiated as linearly polarized light whose polarizing direction is that of P-polarized light with respect to the incident plane, then the incident reference beam 523a before the total internal reflection in the recording plate 503 and the reference beam 523b after the total internal reflection will have directions perpendicular to each other, and consequently, the incident reference beam 523a and the totally reflected reference beam 523b will not interfere with each other.

Now, the light beam having passed through the half-wave plate 515 then passes through the shutter 517 and is converted into a parallel light beam of a desired sectional area by a beam expander 505, whereafter it is reflected downwardly by a mirror 508 and illuminates the mask 504 (illuminating beam 525). Then, light transmitted through and diffracted by the mask 504 enters, as a subject beam, the recording plate 503. The half-wave plate 515, the shutter 517, the beam expander 505 and the mirror 508 constitute a first illuminating optical system in the present embodiment.

Here, a detailed construction of associated portions of the prism 501, the recording plate 503 and the mask 504 in the present embodiment will be described with reference to FIGS. 24 and 25.

Figure 24:
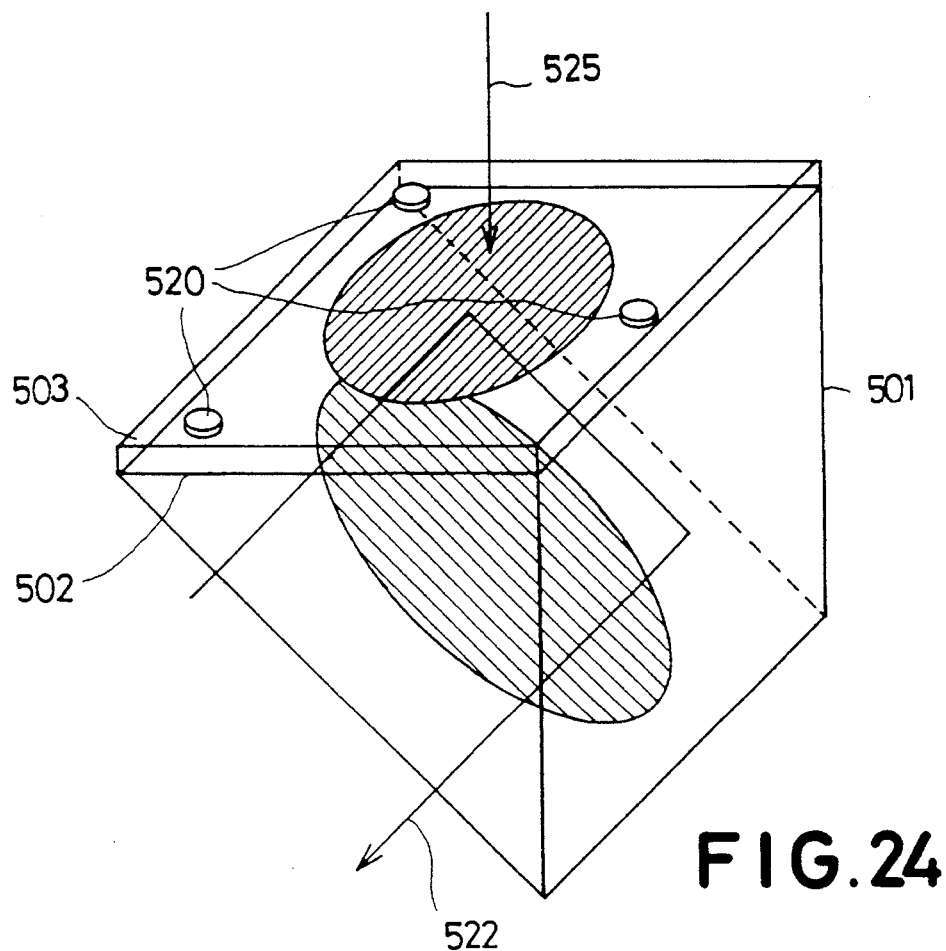
FIG. 24 shows an example of construction of a prism employed in the exposure apparatus according to the fourth embodiment.
Figure 25:
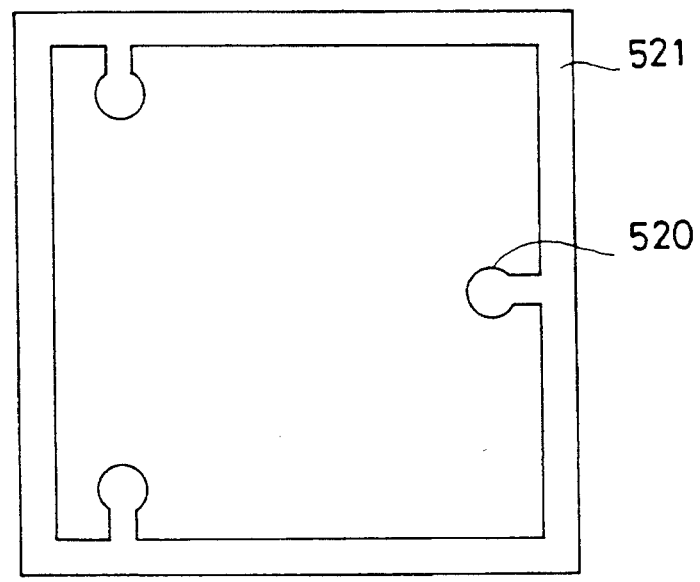
FIG. 25 shows a shape in plan of a spacer member which is employed in the exposure apparatus according to the fourth embodiment.

Referring first to FIG. 24, the hologram recording plate 503 is placed horizontally on and contacted closely with a horizontal shorter side face of the rectangular prism 501, whose comparatively long inclined face is disposed in an inclined condition by the angle of 45 degrees with respect to the horizontal plane, by way of an index matching liquid layer 502 having a refractive index substantially equal to that of the prism 501. The recording plate 503 actually includes, a photo-polymer layer as a recording medium layer provided on a supporting substrate such as a glass plate having a refractive index equal to that of the prism 501, but here, the supporting substrate and the recording medium layer are referred to collectively as recording plate for simplification of description.

A plurality of spacers 520 of a predetermined thickness (several μm to several hundreds μm) are disposed on the recording plate 503 as shown in FIG. 24. The spacers 520 are naturally disposed outside irradiation areas of the subject beam 525 and the reference beam 523, that is, hologram forming areas. In the present embodiment, the spacers 520 are constituted from a member formed by shaping a thin film made of brass or a like metal or alloy by photolithography etching. The spacer member particularly has, as shown in FIG. 25, a frame portion 521 having an inner diameter larger than an irradiation area necessary for the recording plate 503, and a plurality of spacers 520 connected to and supported on the frame portion 521. The spacers 520 are always disposed at predetermined positions on the recording plate 503. It is to be noted that naturally the thickness of the frame portion 521 is smaller than the thickness of the spacers 520.

If the mask 504 is placed on the recording plate 503 with such spacers 520 interposed therebetween, then the recording plate 503 and the mask 504 are held in parallel at a desired distance corresponding to the thickness of the spacers 520. It is to be noted that, when the mask 504 is placed on the spacers 520, sometimes the mask 504 is not stabilized only by its own weight. In such an instance, a weight frame formed from a metal plate or a like member which has an opening corresponding to the irradiation area of a subject beam should be placed in an overlapping relationship on the mask 504. In this case, preferably the weight frame to be placed on the mask 504 has a plurality of projections corresponding to the locations of the spacers 520 so that portions where the spacers 520 are present may be held down by the projections of the weight frame.

Subsequently, referring back to FIG. 22, the light beam split by the polarizing beam splitter 514 and transmitted through the half-wave plate 516 is then reflected by the mirror 509 and then passes through the shutter 518, whereafter it is converted into a parallel beam having a diameter equal to about twice that of the aforementioned illuminating beam 525 for the mask 504 by the beam expander 506. The parallel light beam is aligned accurately in the vertical plane so that it may enter the inclined face 501a of the prism 501 perpendicularly to the latter.

In the present embodiment, a second illuminating optical system for a reference beam and a third illuminating optical system for a reconstructing beam which will be hereinafter described are constructed as a single common optical system. In particular, the position of a light shielding change over plate 507 for intercepting a parallel light beam from the beam expander 506 over an area substantially equal to one half the sectional area of the parallel light beam is switchably moved to the solid line position A or the broken line position B in FIG. 22 so that portions of the parallel light beam having the opposite substantially one half areas are changed over such that a selected one of them is illuminated as a reference beam (position A) or a reconstructing beam (position B), which are conjugate with each other. In short, in the present embodiment, the single common illuminating optical system including the half-wave plate 516, the mirror 509, the shutter 518, the beam expander 506 and the light shielding plate 507 functions as a second illuminating optical system for the reference beam and a third illuminating optical system for the reconstructing beam. In such construction of the optical system, while the reference beam is extracted on whichever side of the position A and the position B the light shielding plate 507 is positioned, here, for convenience of description, a light beam 523 which enters the prism 501 when the light shielding plate 507 is positioned at the position A is used as said reference beam, and another light beam 524 which enters the prism 501 when the light shielding plate 507 is positioned at the position B is used as said reconstructing beam.

It is to be noted that, since unnecessary interference occurs if the reference beam 523 and the reconstructing beam 524 enters a right angle corner portion of the prism 501 and are reflected irregularly, it is desirable for a parallel light beam to always be intercepted partially within the range of a fixed area around the optical axis of the illuminating optical system for the reference beam (and the reconstructing beam). In particular, either the light shielding plate 507 is disposed such that an end portion of it adjacent the optical axis at the position A and another end portion adjacent the optical axis at the position B may overlap over a width within a fixed range with each other or another fixed light shielding member is disposed in the proximity of the optical axis.

Now, the reference beam 523 irradiated perpendicularly to an inclined face of the prism 501 passes through the inside of the prism 501 and the index matching liquid layer 502 and enters, as an incident reference beam 523a, the recording plate 503, in which it is totally internally reflected at the boundary of the recording plate 503 from the air on the upper side of the recording plate 503. The totally reflected reference beam 523b passes through the recording plate 503 and the index matching liquid layer 502 again and enters the prism 501, in which it is totally internally reflected at a vertical side face 501b of the prism 501. Thereafter, the reference beam 523b exits from the inclined face 501a of the prism 501 in a direction perpendicular to the inclined face 501a. Thereupon, the subject beam 525 transmitted through the mask 504 interferes with the incident reference beam 523a and with the totally reflected reference beam 523b in the recording plate 503, so that thus formed interference fringes corresponding to the pattern of the mask 504 are recorded as holograms in the recording medium layer of the recording plate 503.

In this instance, if a light beam other than the reference beam and the subject beam which naturally are to interfere with each other is irradiated upon the recording plate 503, then unnecessary ghosts may be recorded, and therefore, attention must be paid to this matter. This will be described below.

First, it is preferable that the surface of the light shielding plate 507 is made of a material which well absorbs the light beams 523 and 524 received at the opposite faces thereof as shown in FIG. 22 and is inclined a predetermined angle with respect to the light beams 523 and 524 so as to minimize occurrence of return light from the surface of the light shielding plate 507. Further, it is also preferable that an antireflection film not shown is coated on the inclined face 501a of the prism 501 so as to reduce multiple reflection between the inclined face 501a and the beam expander 506 and between the inclined face 501a and the light shielding plate 507.

On the other hand, if a zero-order diffracted component of the subject beam from the mask 504 is totally internally reflected at the inclined face 501a in the prism 501, then there is the possibility that the totally reflected light may be further internally reflected perpendicularly at the side face 501b of the prism 501 and advance reversely and the reversely advancing light beam may return into the recording plate 503 to sensitize the recording medium layer. Accordingly, in order to prevent this, also perpendicular antireflection of the side face 501b of the prism 501 necessarily be taken into consideration. Further, it may provides an advantageous result to take a countermeasure for antireflection for some other element such as lenses which constitute the illuminating optical systems for a subject beam and a reference beam.

Furthermore, each of the elements constituting the optical systems described above desirably has a low scattering characteristic, and particularly, it is preferable for the mirrors to use a metal mirror or a multilayer film mirror. Since the metal mirror has a drawback that it is liable to be damaged and cannot be cleaned readily, any mirror which is directed upwardly or obliquely upwardly when it is installed in position, in particular, in the present embodiment, the mirrors 509 and 511, are preferably constructed by means of a multilayer film mirror. Further, as a countermeasure for dust-proof, the entire optical systems may be disposed within a dust-proof casing.

The holograms recorded in the recording plate 503 are fixed by irradiating ultraviolet rays uniformly upon the entire area of the recording plate 503. In the present embodiment, since the subject beam and the reference beam to be irradiated upon recording themselves are ultraviolet rays, there is no necessity of providing another light source for a fixing light beam. In particular, if the mask 504 is removed, after formation of a hologram, from mask carrier means (not shown) and then only the shutter 517 is opened while the shutter 518 is kept closed, then mask irradiating light from the first illuminating optical system can be irradiated as a fixing light beam into the recording plate 503. Further, if only the shutter 518 is opened while the shutter 517 is closed, a light beam from the common illuminating optical system can be irradiated as a fixing light beam into the recording plate 503. Such movements of the shutters 517 and 518 and movements of the mask 504 and a wafer (which will be hereinafter described) are controlled by control means not shown.

In the present embodiment, a microscope 526 for observing a recorded hologram is provided. The microscope 526 is inserted between the mirror 508 and the recording plate 503 by the carrier means not shown after the mask 504 has been retracted from there. In order to observe the surface of the hologram, the focus point of the microscope 526 should be adjusted to the upper surface of the recording plate 503. In order to observe a reconstructed image (described hereinafter) of the hologram, the focus point should be adjusted to the pattern plane position of the mask 504. Further, the microscope 526 can be utilized not only to observe a recorded hologram but also to establish alignment of the recording plate 503 in prior to recording of a hologram. Furthermore, if, for example, a plurality of points on the recording plate 503 are observed and automatic focusing is applied to the points, then leveling of the recording plate 503 can be adjusted.

Next, reproduction of a reconstructed image of a hologram onto a wafer will be described. Upon reconstructing operation, a wafer (not shown) is placed in position in place of the mask 504, and a resist layer applied to the surface of the wafer is positioned at the position at which the plane of the pattern of the mask was located during the recording operation. This can be performed readily by inserting, between the wafer and the recording plate 503, a spacer having the equal thickness to that of the spacers 520 which were inserted between the mask 504 and the recording plate 503 upon recording operation.

After the wafer has been placed in position in such a manner as described above, the shutter 517 is closed, and the light shielding plate 507 is moved to the position B so that a portion which was shielded upon recording operation is opened. If a source light beam from the laser light source is provided, then a reconstructing beam 524 conjugate with a reference beam 523 is irradiated perpendicularly upon the inclined face 501a of the prism 501. The reference beam entering the prism 501 is totally internally reflected at the side face 501b of the prism 501 and then enters the recording plate 503 by way of the index matching liquid layer 502. When the incident reconstructing beam 524 passes through the recording plate 503, part of it is diffracted by interference fringes of a hologram so that conjugate light with the subject beams 525a, 525b and 525c from the mask 504 is projected upwardly from the recording plate 503. Part of the reconstructing beam 524 which has not been diffracted in the recording plate 503 is totally internally reflected at the boundary of the recording plate 503 from the air on the outer side of the recording plate 503. Also the totally reflected light beam is diffracted by the interference fringes of the hologram in the recording plate 503 similarly, and consequently, conjugate light with the subject beam 525a, 525b and 525c from the mask 504 exits upwardly from the recording plate 503.

The conjugate light obtained from the two diffraction routes described above reconstructs an image of the hologram on the resist layer of the wafer disposed at the position at which the mask 504 was, and the mask pattern is reproduced onto the resist layer in this manner. It is to be noted that the totally reflected reconstructing beam, which has not been diffracted in the recording plate 503, passes through the prism 501 and emerges perpendicularly from the inclined face 501 of the prism 501, whereafter it is absorbed and reflected by the light shielding plate 507. In this instance, it is a matter of course that reflection from the light shielding plate 507 be eliminated to the utmost to prevent occurrence of return light to the wafer side.

Further, in the present embodiment, since laser light having a high coherency is employed for the reconstructing beam 524 similarly to the reference beam 523, it is desirable to reduce, upon reproduction of a mask pattern onto a wafer by a hologram, the coherency of the laser light in order to reduce speckle noise. Particularly, either an etalon plate in the Ar laser may be removed only during reconstruction of a hologram or the mirror 509 may be vibrated finely to reduce the coherency of the reconstructing beam 524.

It is to be noted that, though not shown in the figures, it is possible to interpose a suitable aperture stop into the optical path of the reconstructing beam 524 to limit the irradiation area of the hologram so as to partially expose the pattern. Further, in this instance, reproduction of the entire pattern can be performed by moving the aperture stop and the prism 501 relative to each other.

Further, while, in the embodiment described above, a light beam from the light source is split into a subject beam and a reference beam by the polarizing beam splitter 514, a polarizing member need not always be used to split a light beam. In particular, it is possible to replace the polarizing plate 512 with an ND filter (neutral density filter) and replace the polarizing beam splitter 514 with an ordinary half mirror.

Further, while, in the embodiment described above, Ar laser light is used as source light for all of a subject beam, a reference beam and a reconstructing beam, any other light than Ar laser light may be used as the source light. For example, if a mercury lamp or the like is used as a light source for a reconstructing beam so as to reduce the coherency, then speckle noise can be reduced. It is to be noted, however, that, when a light beam having a lower coherency is used for a subject beam and a reference beam in the recording operation, it is necessary to make the optical paths of these two light beams substantially equal in length to each other in accordance with a degree of the coherency.

Furthermore, while, in the embodiment described above, the recording plate 503 is disposed horizontally, if there is no problem with the index matching liquid and so forth, the recording plate 503 may be constructed so as to be disposed vertically. In particular, the prism 501 may be turned by 180 degrees from the posture shown in FIG. 22 around a normal line to the inclined face 501a of the prism 501 so that the recording plate 503 may be positioned adjacent the side face 501b of the prism 501 in FIG. 22.

In addition, while, in the embodiment described above, the single common illuminating optical system is used for both of the illuminating optical system for a reference beam and the illuminating optical system for a reconstructing beam, separate illuminating optical systems may alternatively be provided for a reference beam and a reconstructing beam.

Having now fully described the invention, it will be apparent to one ordinary skilled in the art that many changes and modifications can be made thereto without departing from the spirit and scope of the invention as set forth the following claims.

What is claimed is:

1. An exposure apparatus for reproducing a pattern of a mask onto a photo-sensitive surface of a substrate using holographic techniques, comprising:

a hologram recording plate provided with a photopolymeric recording medium layer being able to record a hologram by a photochemical reaction, a layer containing an index matching liquid disposed in contact with said recording medium layer;

coherent light source means for generating a coherent light beam;

light beam separating means for separating the coherent light beam from said coherent light source means into a first light beam and a second light beam with each light beam lying in a vertical plane;

a prism having a first plane surface oriented along a horizontal plane with said recording plate and said layer of index matching liquid mounted over said first plane surface such that said recording plate is horizontally positioned with the index matching liquid horizontally positioned between said first plane surface of said prism and said recording plate during both a recording operation for forming a volume hologram in said recording plate and a reconstructing operation for forming an image of the hologram thus formed, with said prism having a second plane surface extending obliquely to said first plane surface, and a third plane surface extending obliquely to both said first plane surface and second plane surface;

means for supporting said mask in a spaced relationship from a first illuminating optical system for introducing, during the recording operation, the first light beam within said vertical plane through the mask to form a subject beam which irradiates said recording plate through said gap;

a second illuminating optical system for introducing, during the recording operation, the second light beam as a reference beam in the vertical plane and in a direction perpendicular to said second plane surface of said prism so as to transmit the reference beam into said prism contiguous to said prism so that said reference beam is totally internally reflected from said recording medium layer such that the incident reference beam and the totally reflected reference beam interfere in said recording medium layer with the subject beam to form interference fringes;

means for substituting a substrate for the mask upon commencement of said reconstructing operation in the position of the mask; and a third illuminating optical system for irradiating, during the reconstructing operation, a conjugate beam with the reference beam used for recording operation into said recording plate, in which a volume hologram corresponding to the pattern is formed by the recording operation, to form an image of the hologram on the photosensitive surface of the substrate and further comprising an upwardly erected substantially rigid supporting wall for supporting, in common, said first illuminating optical system, said second illuminating optical system, said third illuminating optical system and said prism and recording plate along a vertical plane parallel to the surface of the supporting wall with said supporting wall having a counterbalance weight conforming to the weight of said optical systems so that said optical systems are isolated from external vibration thereby permitting an accurate hologram to be recorded on the recording plate with a high diffraction efficiency.

2. An exposure apparatus according to claim 1, wherein said light beam separating means produces the first light beam and the second light beam which have different polarized conditions from each other.

3. An exposure apparatus according to claim 1, wherein each of said first illuminating optical system and said second illuminating optical system includes polarizing means for controlling a polarization condition of an irradiating light beam.

4. An exposure apparatus according to claim 1, wherein said prism is constituted from a substantially rectangular prism having said first plane of a comparatively smaller size, said second plane comparatively larger size than said first plane, and said third plane extending perpendicularly to said first plane, said first plane and said third plane having a substantially same size, the reference beam entering said second plane perpendicularly to the latter.

5. An exposure apparatus according to claim 1, wherein said first illuminating optical system further includes an optical system for observing the hologram formed in said recording medium layer or a reconstruction image of the hologram.

6. An exposure apparatus according to claim 1, further comprising a spacer of a predetermined thickness provided on the other surface of said recording plate for supporting the mask or the substrate thereon so that the gap may be maintained.

7. An exposure apparatus for reproducing a pattern of a mask onto a photo-sensitive surface of a substrate using holographic techniques, comprising:

a hologram recording plate provided with a photopolymeric recording medium layer being able to record a hologram by a photochemical reaction;

coherent light source means for generating a coherent light beam;

light beam separating means for separating the coherent light beam from said coherent light source means into a first light beam and a second light beam with each light beam lying in a vertical plane;

a prism having a first plane surface oriented along a horizontal plane with said recording plate being mounted over said first plane surface such that said recording plate is horizontally positioned during both a recording operation for forming a volume hologram in said recording plate and a reconstructing operation for forming an image of the hologram thus formed, with said prism having a second plane surface extending obliquely to said first plane surface, and a third plane surface extending obliquely to both said first plane surface and second plane surface;

means for supporting said mask in a spaced relationship from a first illuminating optical system for introducing, during the recording operation, the first light beam within said vertical plane through the mask to form a subject beam which irradiates said recording plate through said gap;

a second illuminating optical system for introducing, during the recording operation, the second light beam as a reference beam in the vertical plane and in a direction perpendicular to said second plane surface of said prism so as to transmit the reference beam into said prism contiguous to said prism so that said reference beam is total internally reflected from said recording medium layer such that the incident reference beam and the totally reflected reference beam interfere in said recording medium layer with the subject beam to form interference fringes;

means for substituting a substrate for the mask upon commencement of said reconstructing operation at the position of the mask;

a third illuminating optical system for irradiating, during the reconstructing operation, a conjugate beam with the reference beam used for recording operation into said recording plate, in which a volume hologram corresponding to the pattern is formed by the recording operation, to form an image of the hologram on the photosensitive surface of the substrate wherein said second illuminating optical system and said third illuminating optical system are composed by a single common illuminating optical system having functions of both of said second illuminating optical system and said third illuminating optical system, said common illuminating optical system including beam shaping means for shaping the second light beam into a parallel light beam parallel to the vertical plane and irradiating the parallel light beam into said second plane of said prism and optical path selecting means for selectively changing over the parallel light beam to enter a first defined portion different from said first defined portion, said parallel light beam being entered during the recording operation as the reference beam only into the first portion, and said parallel light beam being entered during the reconstructing operation as the reconstructing light beam only into said second portion.

8. An exposure apparatus according to claim 7, wherein said prism is constituted from a substantially rectangular prism having said first plane of a comparatively smaller size, said second plane comparatively larger size than said first plane, and said third plane extending perpendicularly to said first plane, said first plane and said third plane having a substantially same size, said parallel light beam entering said second plane perpendicularly to the latter so as to direct the optical axis thereof to a corner at which said first plane and said third plane intersect each other, said optical path selecting means including selectively operable shutter means for selectively intercepting a part of parallel light beam on each side of the parallel light beam with respect to the center of the optical axis of said parallel light beam.

* * * * *